(12) United States Patent
Yoshida et al.

(10) Patent No.: US 10,278,290 B2
(45) Date of Patent: Apr. 30, 2019

(54) ELECTRONIC COMPONENT EMBEDDED SUBSTRATE

(71) Applicant: TDK CORPORATION, Tokyo (JP)

(72) Inventors: Kenichi Yoshida, Tokyo (JP); Mitsuhiro Tomikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/654,281

(22) Filed: Jul. 19, 2017

(65) Prior Publication Data

US 2018/0027660 A1  Jan. 25, 2018

(30) Foreign Application Priority Data

Jul. 19, 2016 (JP) .................. 2016-141654
Jul. 19, 2016 (JP) .................. 2016-141655
Jun. 16, 2017 (JP) .................. 2017-119034

(51) Int. Cl.
*H01L 27/108* (2006.01)
*H01L 29/76* (2006.01)
*H01L 29/94* (2006.01)
*H01L 31/119* (2006.01)
*H05K 1/18* (2006.01)
*H05K 1/11* (2006.01)
*H05K 1/03* (2006.01)
*H01L 23/00* (2006.01)
*H01L 23/538* (2006.01)

(52) U.S. Cl.
CPC ......... *H05K 1/185* (2013.01); *H01L 23/5389* (2013.01); *H01L 24/25* (2013.01); *H01L 24/82* (2013.01); *H05K 1/036* (2013.01); *H05K 1/115* (2013.01); *H01L 2224/08155* (2013.01); *H01L 2224/27436* (2013.01); *H01L 2224/73265* (2013.01)

(58) Field of Classification Search
CPC ....... H01L 23/5387; H01L 2924/19103; H01L 21/84; H01L 23/5223
See application file for complete search history.

(56) References Cited

U.S. PATENT DOCUMENTS 4,008,514 A  2/1977 Elderbaum
6,207,522 B1  3/2001 Hunt et al.
(Continued)

FOREIGN PATENT DOCUMENTS

JP  2008-034417 A  2/2008
JP  2008-034418 A  2/2008

*Primary Examiner* — Bradley Smith
*Assistant Examiner* — David J Goodwin
(74) *Attorney, Agent, or Firm* — Oliff PLC

(57) ABSTRACT

An electronic component embedded substrate 1 includes a substrate 10 having a wiring layer 11 and an insulating layer 12; an electronic component 20 built in the substrate 10, and having a pair of electrode layers 21A and 21B, and a dielectric layer 22; and a stress relieving layer 30 provided closer to the wiring layer 11 than the insulating layer 12 is in the lamination direction, wherein at least part of an end portion of the electronic component 20 on the wiring layer 11 side is in contact with the stress relieving layer 30, wherein at least part of an end portion of the electronic component 20 on the insulating layer 12 side is in contact with the insulating layer 12, and wherein the Young's modulus of the stress relieving layer 30 is lower than the Young's modulus of the electrode layer 21B.

19 Claims, 19 Drawing Sheets

(56) References Cited

U.S. PATENT DOCUMENTS

| | | | |
|---|---|---|---|
| 7,375,022 B2* | 5/2008 | Oi | H01L 23/49822 174/260 |
| 2002/0145845 A1 | 10/2002 | Hunt et al. | |
| 2004/0164337 A1* | 8/2004 | Yamasaki | H01L 21/6835 257/300 |
| 2004/0180540 A1* | 9/2004 | Yamasaki | H01L 21/4857 438/667 |
| 2005/0011857 A1 | 1/2005 | Borland et al. | |
| 2006/0079050 A1 | 4/2006 | Cahalen et al. | |
| 2008/0072409 A1 | 3/2008 | Kato et al. | |
| 2010/0093150 A1 | 4/2010 | Kato et al. | |
| 2017/0263695 A1* | 9/2017 | Balakrishnan | H01L 27/0629 |

\* cited by examiner

ELECTRONIC COMPONENT EMBEDDED SUBSTRATE

TECHNICAL FIELD

The present invention relates to an electronic component embedded substrate.

BACKGROUND

As electronic components are made compact, miniaturization including a reduction in height is also required for electronic components used for electronic component embedded substrates. For example, Japanese Unexamined Patent Publication No. 2008-34417 and Japanese Unexamined Patent Publication No. 2008-34418 disclose a thin film capacitor having a small overall thickness and suitable for being embedded in an electronic component embedded substrate.

SUMMARY

However, in the capacitor whose height is reduced as described above, the dielectric layer and the like of the capacitor may be deformed when an external force generated when the electronic component embedded substrate is handled or the like is applied to the capacitor.

The present invention has been made in view of the above, and has an object to provide an electronic component embedded substrate capable of suppressing the influence of an external force on an electronic component.

To achieve the above-described object, an electronic component embedded substrate according to an embodiment of the present invention includes: a substrate having a wiring layer and an insulating layer laminated on the wiring layer; an electronic component built in the substrate, and having a pair of electrode layers extending in a direction intersecting with a lamination direction of the substrate, and a dielectric layer provided between the pair of electrode layers; and a stress relieving layer provided closer to the wiring layer than the insulating layer is in the lamination direction, wherein at least part of an end portion of the electronic component on the wiring layer side is in contact with the stress relieving layer in the lamination direction, at least part of an end portion of the electronic component on the insulating layer side is in contact with the insulating layer in the lamination direction, and a Young's modulus of the stress relieving layer is lower than a Young's modulus of the electrode layer positioned on the wiring layer side.

In the above-described electronic component embedded substrate, at least part of the end portion of the electronic component on the wiring layer side is in contact with the stress relieving layer. Since the Young's modulus of the stress relieving layer is lower than the Young's modulus of the electrode layer positioned on the wiring layer side, the external force applied to the electronic component is relieved by the stress relieving layer. Therefore, it is possible to suppress the influence of the external force on the electronic component.

In an embodiment, the stress relieving layer may include a first stress relieving layer having insulating properties and a second stress relieving layer having conductivity, and the second stress relieving layer may be provided closer to an exposed surface of the wiring layer than the electrode layer positioned on the wiring layer side. In this case, the first stress relieving layer can be disposed at a place where insulating properties are required, such as a place between the electrode layer positioned on the wiring layer side and the wiring layer, and the second stress relieving layer can be disposed at a place where conductivity is required, such that the second stress relieving layer is disposed closer to exposed surface side of the wiring layer than the electrode layer positioned on the wiring layer side is. This makes it possible to increase the contact area between the stress relieving layer and the electronic component, so that the external force applied to the electronic component is further relieved. Therefore, it is possible to further suppress the influence of the external force on the electronic component.

An electronic component embedded substrate according to an embodiment of the present invention includes: a substrate having a wiring layer and an insulating layer laminated on the wiring layer; an electronic component built in the substrate, and having a pair of electrode layers extending in a direction intersecting with a lamination direction of the substrate, and a dielectric layer provided between the pair of electrode layers; and a stress relieving layer provided closer to the wiring layer than the insulating layer is in the lamination direction, and having insulation, wherein at least part of an end portion of the electronic component on the wiring layer side is in contact with the stress relieving layer in the lamination direction, at least part of an end portion of the electronic component on the insulating layer side is in contact with the insulating layer in the lamination direction, and a Young's modulus of the stress relieving layer is lower than a Young's modulus of the electrode layer positioned on the wiring layer side.

At least part of one end portion of the above-described electronic component embedded substrate in the lamination direction of the electronic component positioned on the wiring layer side is in contact with the stress relieving layer. Since the Young's modulus of the stress relieving layer is lower than the Young's modulus of the electrode layer positioned on the wiring layer side, the external force applied to the electronic component is relieved by the stress relieving layer. Therefore, it is possible to suppress the influence of the external force on the electronic component. The stress relieving layer has insulating properties. Therefore, even when the electric component is deformed by external force, insulation between the electrode layer positioned on the wiring layer side and the other component can be maintained by the stress relieving layer.

An electronic component embedded substrate according to an embodiment of the present invention includes: a substrate having a wiring layer and an insulating layer laminated on the wiring layer; an electronic component built in the substrate, and having a pair of electrode layers extending in a direction intersecting with a lamination direction of the substrate, and a dielectric layer provided between the pair of electrode layers; and a stress relieving layer provided closer to an exposed surface of the wiring layer than the electrode layer positioned on the wiring layer side is, and having conductivity, wherein a Young's modulus of the stress relieving layer is lower than a Young's modulus of the electrode layer positioned on the wiring layer side.

In the above-described electronic component embedded substrate, a stress gap layer is provided closer to an exposed surface side of wiring layer than the electrode layer positioned on the wiring layer side. Since the Young's modulus of the stress gap layer is lower than the Young's modulus of the electrode layer, the external force applied to the electronic component is relieved by the stress gap layer. Therefore, deformation of the dielectric layer of the electronic component due to external force can be suppressed. In addition, since the stress gap layer has conductivity, it is possible to suppress the influence of external force on the electronic component while maintaining the electrical connection with the electrode layer.

In an embodiment, at least part of the electronic component may be embedded in the wiring layer, and the stress relieving layer may be exposed from the wiring layer side of the electronic component embedded substrate. According to this configuration, since at least part of the electronic component is embedded in the wiring layer, the dimension in the lamination direction of the electronic component embedded substrate can be reduced.

In an embodiment, the stress relieving layer and the electronic component may be sequentially laminated on the wiring layer, and the stress relieving layer may be in contact with the wiring layer. According to this configuration, since the stress relieving layer is formed between the electronic component and the wiring layer, it is possible to suppress the electronic component from receiving the influence of the external force from, in particular, the lamination direction of the electronic component and the stress relieving layer. Further, when the stress relieving layer has conductivity, the electrode layer and the wiring layer can be electrically connected via the stress relieving layer.

In an embodiment, the Young's modulus of the stress relieving layer may be lower than the Young's modulus of the wiring layer. According to this configuration, the Young's modulus of the stress relieving layer is lower than the Young's modulus of the wiring layer. Thus, it is possible to further relieve the external force applied to the electronic component when the electronic component is laminated on the wiring layer. Therefore, it is possible to effectively suppress the influence of the external force on the electronic component. In particular, it is possible to effectively suppress the deformation of the dielectric layer of the electronic component due to external force.

In one embodiment, the Young's modulus of the stress relieving layer may be lower than the Young's modulus of the insulating layer. According to this configuration, the Young's modulus of the stress relieving layer is lower than the Young's modulus of the insulating layer. Thus, the external force applied to the electronic component can be further relieved. Therefore, it is possible to effectively suppress the influence of the external force on the electronic component.

According to the present invention, there is provided an electronic component embedded substrate capable of suppressing the influence of an external force on an electronic component.

DETAILED DESCRIPTION

Figure 1:
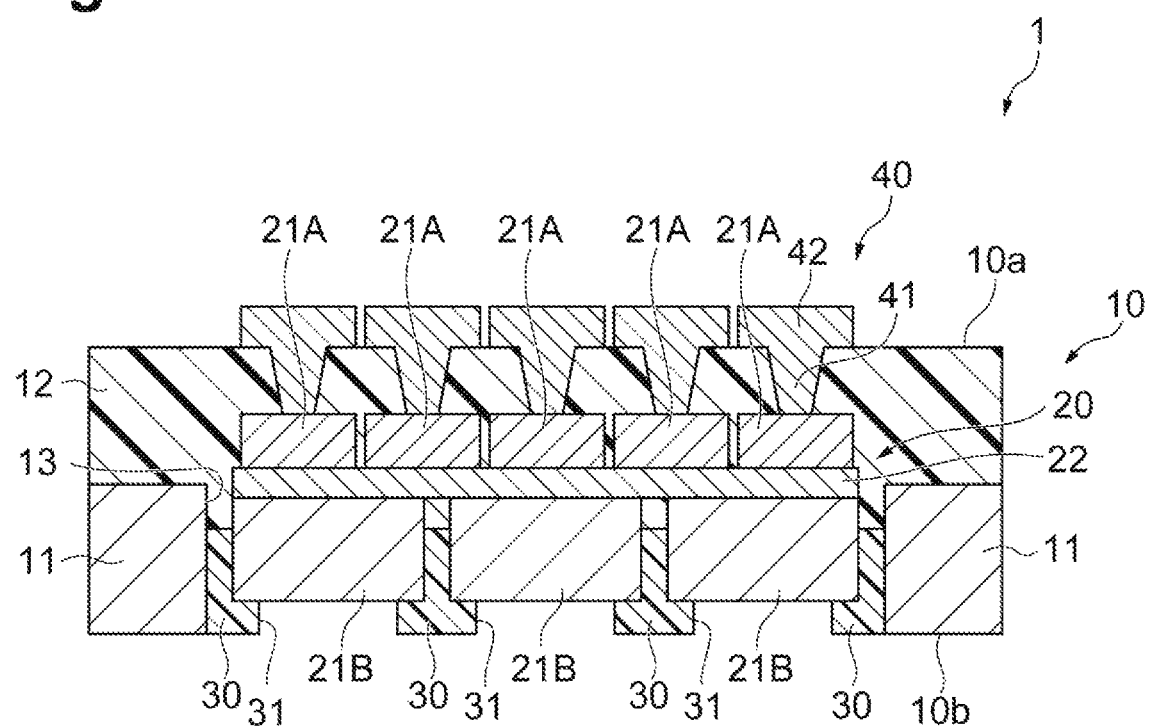
FIG. 1 is a schematic cross-sectional view of an electronic component embedded substrate according to a first embodiment of the present invention.

Hereinafter, various embodiments will be described in detail with reference to the drawings. In each drawing, the same or corresponding parts are denoted by the same reference numerals, and redundant explanations are omitted.

First Embodiment

FIG. 1 is a schematic cross-sectional view of an electronic component embedded substrate according to a first embodiment of the present invention. The electronic component embedded substrate 1 shown in FIG. 1 is a substrate used for, for example, a communication terminal or the like. As shown in FIG. 1, the electronic component embedded substrate 1 includes a substrate 10, an electronic component 20 built in the substrate 10, and a stress relieving layer 30. The substrate 10 has a wiring layer 11 and an insulating layer 12 laminated on the wiring layer 11. The electronic component 20 is built in the substrate 10, and includes a pair of electrode layers composed of a first electrode layer 21A and a second electrode layer 21B extending in a direction crossing the lamination direction in which the wiring layer 11 and the insulating layer 12 are laminated, and has a dielectric layer 22 provided therebetween. Here, the electronic component 20 is "built in" the substrate 10 means a state in which the electronic component 20 is not exposed from the main surface (the main surface 10a or the main surface 10b) of the substrate 10.

Further, the stress relieving layer 30 of the electronic component embedded substrate 1 is provided closer to the wiring layer 11 than the insulating layer 12 is in the lamination direction. In the lamination direction, at least part of one end portion (second electrode layer 21B) of the electronic component 20 positioned on the wiring layer 11 side is in contact with the stress relieving layer 30, and at least part of the other end portion (first electrode layer 21A) of the electronic component 20 positioned on the insulating layer 12 side is in contact with the insulating layer 12. Here, the "end portion" is a portion near the end surface of the first electrode layer 21A or the second electrode layer 21B in the lamination direction, and the "end portion" also includes a side surface extending in a direction (lamination direction) crossing the end surface of the first electrode layer 21A or the second electrode layer 21B.

In addition, the electronic component embedded substrate 1 has a connection terminal 40 that is electrically connected to the first electrode layer 21A of the electronic component 20. In the present embodiment, the opening 13 is provided in the wiring layer 11, and the electronic component 20 is disposed in the opening 13. As a result, at least part of the electronic component 20 is embedded in the wiring layer 11. Here, the "state in which at least part of the electronic component 20 is embedded in the wiring layer 11" means a state in which the electronic component 20 and the wiring layer 11 overlap in the lamination direction.

The substrate 10 is a so-called multilayer circuit board, and the pair of its main surfaces 10a and 10b is an end of the wiring layer 11 and an end of the insulating layer 12 in the lamination direction, respectively, wherein the two ends are opposed to each other. The main surface 10a is an end surface of the insulating layer 12 of the substrate 10, and the main surface 10b is an end surface of the wiring layer 11 of the substrate 10. The wiring layer 11 is made of a conductive material such as copper (Cu). Further, the wiring layer 11 is provided with an opening 13 for arranging the electronic component 20. The insulating layer 12 is made of an insulating material such as an epoxy resin, a polyimide resin, an acrylic resin, or a phenolic resin. The insulating material constituting the insulating layer 12 is preferably a material whose hardness changes by a specific treatment, such as a thermosetting resin or a photocurable resin. In addition, in the opening 13 of the wiring layer 11, the insulating layer 12 is also provided such that the gap between the electronic component 20 and the opening 13 is filled with the insulating layer 12. The total thickness of the substrate 10 can be, for example, about 40 µm to 1000 µm. Further, the thickness of the wiring layer 11 can be about 2 µm to 40 µm, and the thickness of the insulating layer 12 can be about 1 µm to 200 µm. The entire thickness of the substrate 10, the thickness of the wiring layer 11, and the thickness of the insulating layer 12 are not particularly limited.

The electronic component 20 is a low profile capacitor having a first electrode layer 21A, a second electrode layer 21B, and a dielectric layer 22 provided between the first electrode layer 21A and the second electrode layer 21B. Each of the first electrode layer 21A and the second electrode layer 21B is divided into a plurality of portions. In the present embodiment, the first electrode layer 21A is divided into five portions. In addition, the second electrode layer 21B is divided into three portions. In the present embodiment, the so-called TFCP (Thin Film Capacitor) will be described wherein the electronic component 20 includes the first electrode layer formed of a metal thin film, and the dielectric layer 22 formed of a dielectric film. In the electronic component 20, the total thickness of the three layers is about 5 µm to 650 µm. The thickness of the first electrode layer 21A may be about 0.1 µm to 50 µm, the thickness of the dielectric layer 22 may be about 0.05 µm to 100 µm, and the thickness of the second electrode layer 21B may be about 5 µm to 500 µm.

A material of the first electrode layer 21A and the second electrode layer 21B, preferably includes, as their main components, nickel (Ni), copper (Cu), aluminum (Al), platinum (Pt), an alloy containing these metals, or an intermetallic compound. However, the materials of the first electrode layer 21A and the second electrode layer 21B are not particularly limited as long as they are conductive materials. In the present embodiment, the case where the first electrode layer 21A contains copper as a main component and the second electrode layer 21B contains nickel as a main component will be described. "Main component" means that the proportion of the component is 50 mass % or more. In addition, the aspect of the first electrode layer 21A and the second electrode layer 21B may include forming not only an alloy or an intermetallic compound but also forming a laminate structure including two or more kinds of alloys or compounds. For example, an electrode layer may be formed as a two-layer structure in which a Cu thin film is provided on a Ni thin film. When pure Ni is used as the first electrode layer 21A and/or the second electrode layer 21B, the purity of Ni is preferably 99.99% or more. Furthermore, in the case of an alloy containing Ni, the metal other than Ni to be contained is preferably at least one selected from the group consisting of platinum (Pt), palladium (Pd), iridium (Ir), rhodium (Rh), ruthenium (Ru), osmium (Os), rhenium (Re), tungsten (W) chromium (Cr), tantalum (Ta), silver (Ag) and copper (Cu). The Young's modulus of the material used for the second electrode layer 21B is, for example, about 10 GPa to 250 GPa.

Further, the dielectric layer 22 is made of a perovskite-based dielectric material. Here, the perovskite-based dielectric material in this embodiment includes a ferroelectric material having a perovskite structure such as BaTiO3 (barium titanate), $(Ba_{1-x}Sr_x)TiO_3$ (barium strontium titanate), $(Ba_{1-x}Ca_x)TiO_3$, $PbTiO_3$, $Pb(Zr_xTi_{1-x})O_3$, a complex perovskite relaxor type ferroelectric material typified by $Pb(Mg_{1/3}Nb_{2/3})O_3$, and the like. Here, in the perovskite structure and the perovskite relaxor type dielectric material, the ratio between the A site and the B site is usually an integer ratio, but it may be intentionally shifted from the integer ratio in order to improve the characteristics. In addition, in order to control the characteristics of the dielectric layer 22, the dielectric layer 22 may contain an additive appropriately as an auxiliary component.

The stress relieving layer 30 is provided closer to the wiring layer 11 than the insulating layer 12 is in the lamination direction. The stress relieving layer 30 is in contact with part of the end surface of the second electrode layer 21B of the electronic component 20 on the wiring layer 11 side (lower side in the drawing) and part of the side surface the second electrode layer 21B on the wiring layer 11 side (main surface 10b side of wiring layer 11). In addition, the stress relieving layer 30 is provided in the opening 13 of the wiring layer 11, and is exposed from the main surface 10b of the substrate 10 on the wiring layer 11 side. The stress relieving layer 30 is provided up to a vertical position overlapping with the second electrode layer 21B of the electronic component 20 in the lamination direction of the substrate 10. In the present embodiment, a plurality (for example, three) of openings 31 each corresponding to the divided second electrode layer 21B are provided in the stress relieving layer 30. The end surface of the second electrode layer 21B is exposed from the opening 31. The electronic component 20 is electrically connected to an external electronic component, wiring, or the like via the second electrode layer 21B exposed from the opening 31. With such a structure, the stress relieving layer 30 is also provided closer to the wiring layer 11 (specifically, exposed surface 10b) than the second electrode layer 21B is.

The stress relieving layer 30 may be in contact with at least part of the end portion of the second electrode layer 21B in the lamination direction of the substrate 10. However, as with the electronic component embedded substrate 1, it is preferable that the stress relieving layer 30 be in contact with the end surface of the second electrode layer 21B in the lamination direction, and the side surface intersecting this end surface and continuing to this end surface. In the present embodiment, the stress relieving layer 30 is also provided between the individual divided second electrode layers 21B and between the second electrode layer 21B and the wiring layer 11. With such a structure, it is possible to relieve not only the external force in the lamination direction of the substrate 10 but also the external force from the direction different from the lamination direction. In addition, since the stress relieving layer 30 has insulating properties, it is possible to reliably suppress short-circuiting between the individual divided second electrode layers 21B or between the second electrode layer 21B and the wiring layer 11.

The material of the stress relieving layer 30 is not particularly limited as long as it is an insulating material. Nonconductive resin (Non Conductive Paste: NCP) or the like is preferably used, for example. The Young's modulus of the stress relieving layer 30 can be, for example, 0.1 GPa to 50 GPa. The stress relieving layer 30 is made of a material having a Young's modulus lower than the Young's modulus of the second electrode layer 21B of the electronic component 20. Further, it is preferable that the Young's modulus of the material constituting the stress relieving layer 30 be lower than any of the other members (the first electrode layer 21A and the dielectric layer 22) of the electronic component 20, the wiring layer 11, and the insulating layer 12. From the viewpoint of improving the durability of the electronic component embedded substrate 1, it is preferable that the stress relieving layer 30 be not only in contact with the electronic component 20 but also physically bonded. Therefore, it is more preferable that a material such as a thermosetting resin or a photocurable resin, whose hardness is changed, be used for the stress relieving layer 30.

The connection terminal 40 is provided corresponding to each of the divided first electrode layers 21A, and is electrically connected to the first electrode layer 21A. This embodiment shows an example in which five connection terminals 40 are provided. Each of the connection terminals 40 includes a via 41 penetrating the insulating layer 12 between the main surface 10a of the substrate 10 and the first electrode layer 21A, and a terminal portion 42 which is continuous with the via 41 and is exposed from the main surface 10a. The first electrode layer 21A is electrically connected to an external electronic component, wiring, or the like through the connection terminal 40.

Next, a method of manufacturing the electronic component embedded substrate 1 will be described with reference to FIGS. 2A to 4C. FIGS. 2A to 4C are views for explaining a method of manufacturing the electronic component embedded substrate shown in FIG. 1. FIGS. 2A to 4C show one method of manufacturing one electronic component embedded substrate 1. Practically, after forming a plurality of electronic component embedded substrates 1 on one wafer, they are divided into respective electronic component embedded substrates 1. FIGS. 2A to 4C are enlarged views showing part of one wafer.

Figure 2A:
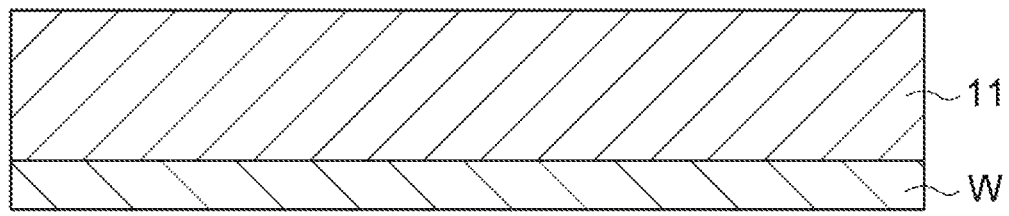
FIGS. 2A, 2B and 2C are views for explaining a method of manufacturing the electronic component embedded substrate shown in FIG. 1.

First, as shown in FIG. 2A, a wafer W as a base material is prepared, and the wiring layer 11 is formed on the wafer W. The material of the wafer W is not particularly limited, and for example, a Si wafer or the like can be used. The wiring layer 11 is formed by plating, for example. The wafer W on which the wiring layer 11 is formed may be prepared in advance.

Figure 2B:
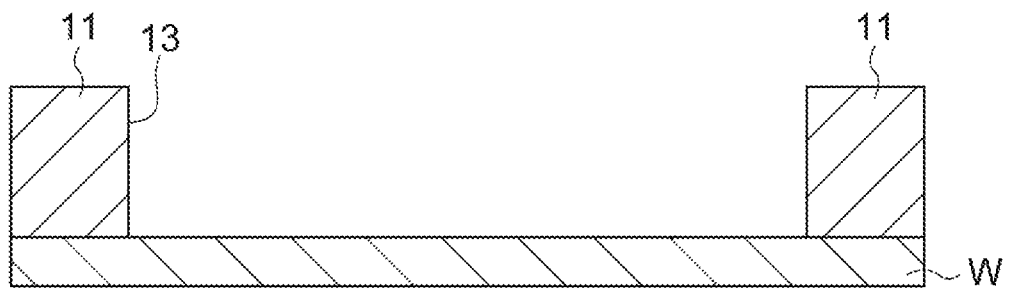

Next, as shown in FIG. 2B, the opening 13 in which the electronic component 20 is embedded is formed in the wiring layer 11. A general photolithography technique can be used to form the opening 13. Specifically, after coating the wiring layer 11 with a photoresist, an actinic ray such as UV light is applied through a photomask. Next, the photoresist in the portion where the opening 13 is to be formed is removed by developing. Thereafter, the wiring layer 11 is etched using the photoresist as a mask. After etching of the wiring layer 11 is completed, the photoresist is removed. The material of the mask is not particularly limited, and a metal thin film such as chromium (Cr) or tungsten (W) may be used instead of the photoresist. The method of etching the wiring layer 11 is also not particularly limited, and a known wet etching process or dry etching process can be used.

Figure 2C:
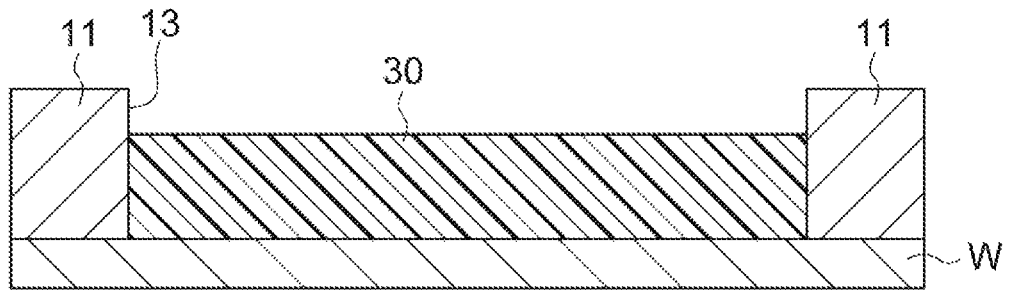

Next, as shown in FIG. 2C, the stress relieving layer 30 is formed in the opening 13. When the stress relieving layer 30 is formed of a material, such as a thermosetting resin or a photocurable resin, whose hardness is changed, a resin material in an uncured state is disposed in the opening 13. The resin material is left uncured in order to embed the electronic component 20 in a later step.

Figure 3A:
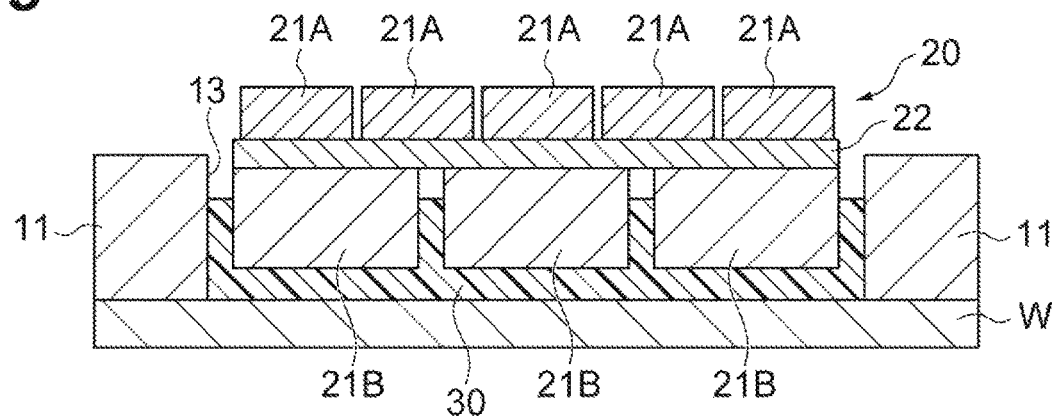
FIGS. 3A and 3B are views for explaining the method of manufacturing the electronic component embedded substrate shown in FIG. 1.

Next, as shown in FIG. 3A, the electronic component 20 is arranged in the opening 13. The electronic component 20 including the first electrode layer 21A, the dielectric layer 22 and the second electrode layer 21B can be manufactured by a known method. The electronic component 20 is arranged in a state in which at least part thereof is embedded in the uncured stress relieving layer 30. Thereafter, the uncured stress relieving layer 30 is cured. As a result, the electronic component 20 is embedded in the opening 13 and the stress relieving layer 30, and the electronic component 20 and the stress relieving layer 30 are physically bonded to each other.

Figure 3B:
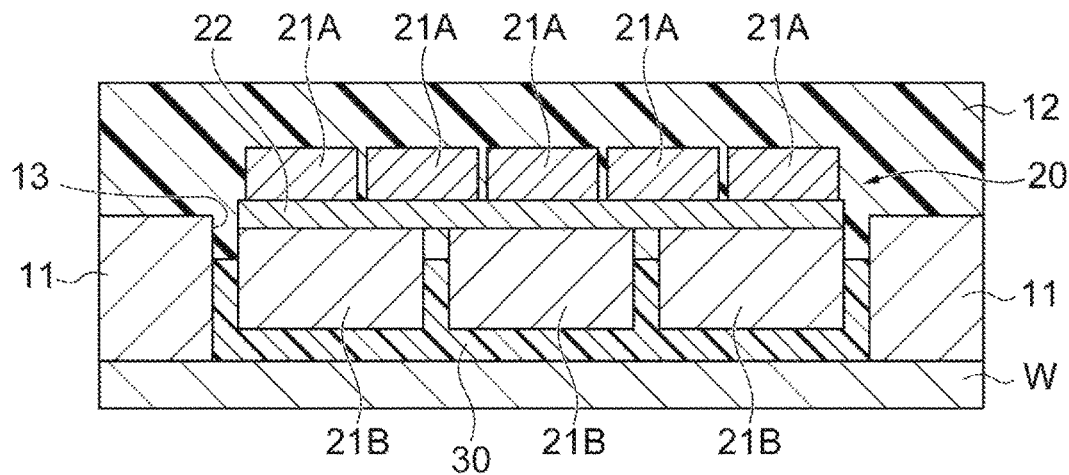

Next, as shown in FIG. 3B, the insulating layer 12 is formed on the wiring layer 11. The insulating layer 12 is formed, for example, by applying a thermosetting resin in an uncured state and then heating and curing the applied resin. The insulating layer 12 may be formed by applying a photocurable resin in an uncured state and then apply light of a specific wavelength to cure it. Through this process, the insulating layer 12 is laminated on the wiring layer 11, a space between the opening 13 and the electrodes is filled with the resin constituting the insulating layer 12, and the electronic component 20 and the stress relieving layer 30 are sealed by the insulating layer 12.

Figure 4A:
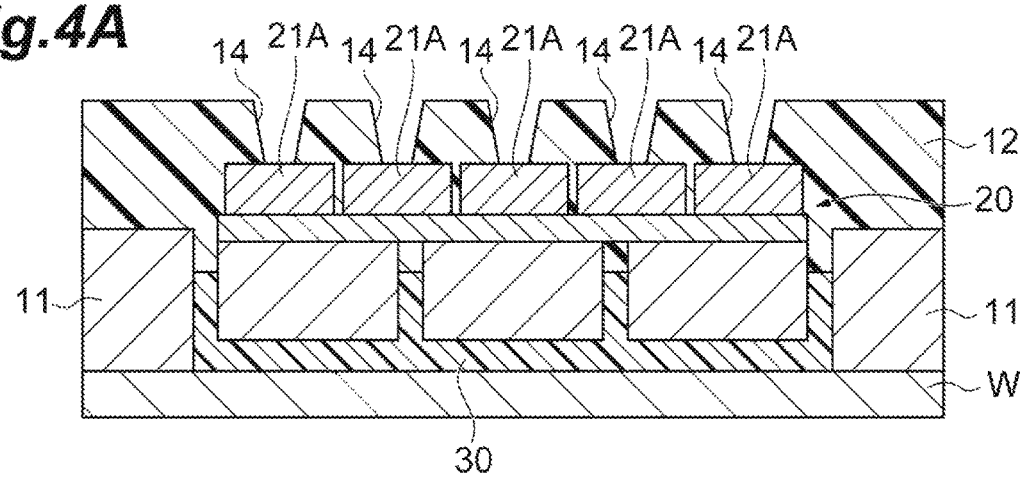
FIGS. 4A, 4B and 4C are views for explaining the method of manufacturing the electronic component embedded substrate shown in FIG. 1.

Next, as shown in FIG. 4A, a plurality of openings 14 each corresponding to the first electrode layers 21A of the electronic component 20 are formed in the insulating layer 12. For example, dry etching using a patterned photoresist as a mask can be used to form the opening 14. Through this step, each of the first electrode layers 21A of the electronic component 20 is exposed from the opening 14.

Figure 4B:
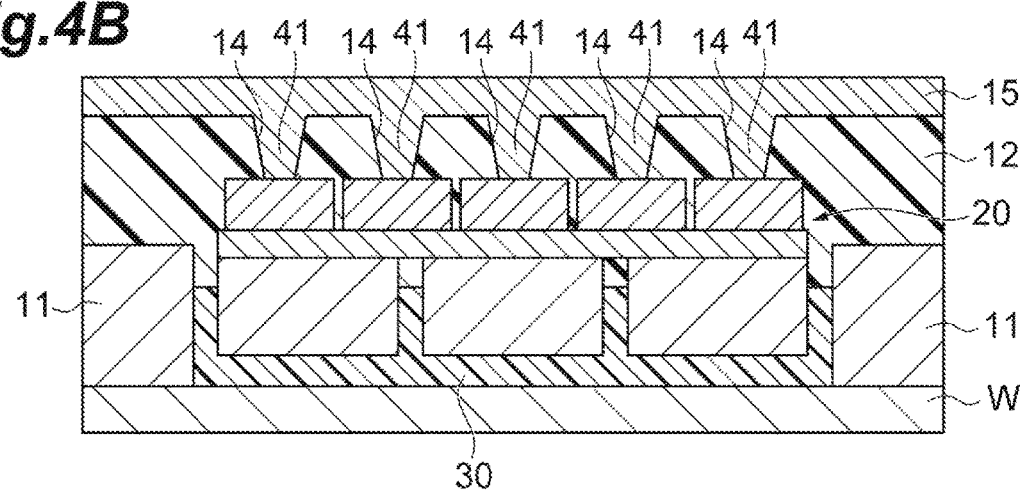

Next, as shown in FIG. 4B, a conductive layer 15 for forming the connection terminal 40 is formed. The conductive layer 15 is formed by plating, for example. Through this process, the conductive layer 15 is formed on the insulating layer 12, the plurality of openings 14 are filled with the conductive layer 15, and the vias 41 of the plurality of connection terminals 40 are formed.

Figure 4C:
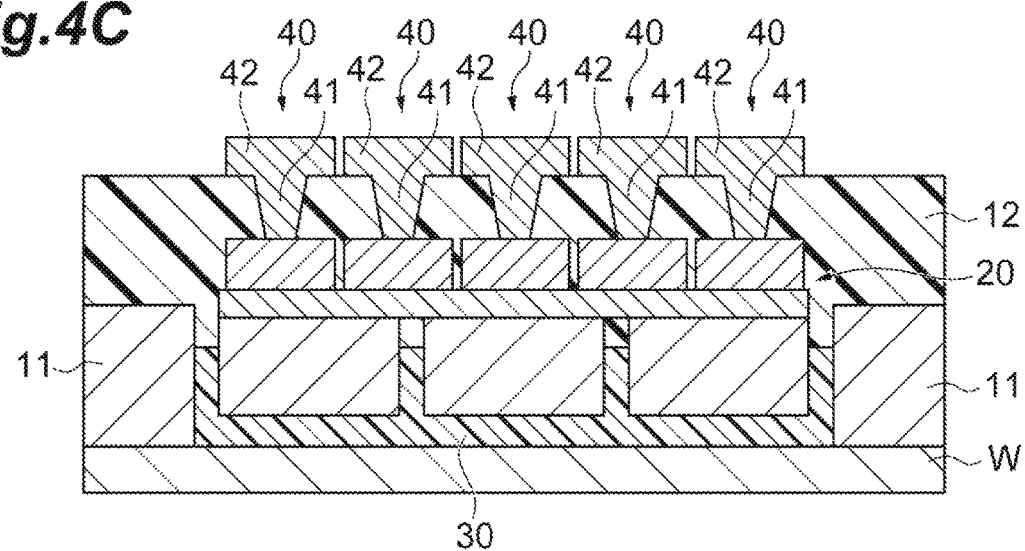

Next, as shown in FIG. 4C, the conductive layer 15 is patterned by etching or the like, so that the terminal portions 42 of the plurality of connection terminals 40 are formed from the conductive layer 15. Through this process, a plurality of connection terminals 40 are formed.

Finally, the wafer W is removed and an opening 31 is formed in the stress relieving layer 30 by etching or the like. Through this step, the second electrode layer 21B of the electronic component 20 is exposed from the opening 31. Thereafter, individualization is performed by dicing or the like, whereby the electronic component embedded substrate 1 as shown in FIG. 1 is obtained.

As described above, in the electronic component embedded substrate 1, at least part of the second electrode layer 21B of the electronic component 20 on the wiring layer 11 side is in contact with the stress relieving layer 30. Since the Young's modulus of the stress relieving layer 30 is lower than the Young's modulus of the second electrode layer 21B positioned on the wiring layer 11 side, the external force applied to the electronic component 20 is relieved by the stress relieving layer 30. Therefore, deformation and the like of the dielectric layer 22 due to the influence of the external force on the electronic component 20 can be suppressed.

In addition, the stress relieving layer 30 has insulating properties. As a result, even when the electronic component 20 is deformed by an external force, insulation between the second electrode layer 21B positioned on the wiring layer 11 side and other components can be maintained by the stress relieving layer 30.

The electronic component embedded substrate 1 includes the electronic component 20 whose height is reduced as described above. In this way, when the height of the electronic component 20 is reduced, the dielectric layer 22 is greatly affected by an external force. In particular, it is considered probable that since the wiring layer 11 has a higher Young's modulus than the insulating layer 12, the external force from the wiring layer 11 side directly affects the dielectric layer 22. Therefore, the stress relieving layer 30 is in contact with the end surface in the lamination direction of the second electrode layer 21B of the pair of electrode layers sandwiching the dielectric layer 22 provided on the wiring layer 11 side, that is, the stress relieving layer 30 is provided closer to the wiring layer 11 (specifically, exposed surface 10b) than the second electrode layer 21B is, so that in particular, when an external force is applied along the lamination direction of the substrate 10 and the electronic component 20, the stress relieving layer 30 can preferably relieve the external force. In this way, when the stress relieving layer 30 is provided closer to the wiring layer 11 than the end surface of the electronic component 20 is (the end surface of the second electrode layer 21B), at the time of manufacturing and handling the electronic component embedded substrate 1, it is possible to suppress the deformation or the like of the dielectric layer 22 due to the influence of the external force on the electronic component 20.

In addition, the Young's modulus of the stress relieving layer 30 can be lower than the Young's modulus of the insulating layer 12. In this manner, when the Young's modulus of the stress relieving layer 30 is lower than the Young's modulus of the insulating layer 12, the external force applied to the electronic component 20 can be further relieved. Therefore, it is possible to effectively suppress the deformation or the like of the dielectric layer 22 due to the influence of the external force on the electronic component 20.

When the Young's modulus of the stress relieving layer 30 is lower than the Young's modulus of the second electrode layer 21B, it is possible to suppress the influence of the external force on the electronic component 20. The difference between the Young's modulus of the stress relieving layer 30 and the Young's modulus of the second electrode layer 21B is preferably 50 GPa or more. The difference between the Young's modulus of the stress relieving layer 30 and the Young's modulus of the insulating layer 12 is preferably 1 GPa or more. Due to such a difference in Young's modulus, it is possible to more favorably relieve the external force by the stress relieving layer 30.

At least part of the electronic component 20 is embedded in the opening 13 of the wiring layer 11, and the stress relieving layer 30 is exposed from the wiring layer 11 side (the main surface 10b of the substrate 10) of the substrate 10. Since at least part of the electronic component 20 is embedded in the wiring layer 11 as described above, it is possible to reduce the size in the lamination direction of the electronic component embedded substrate 1.

Second Embodiment

Figure 5:
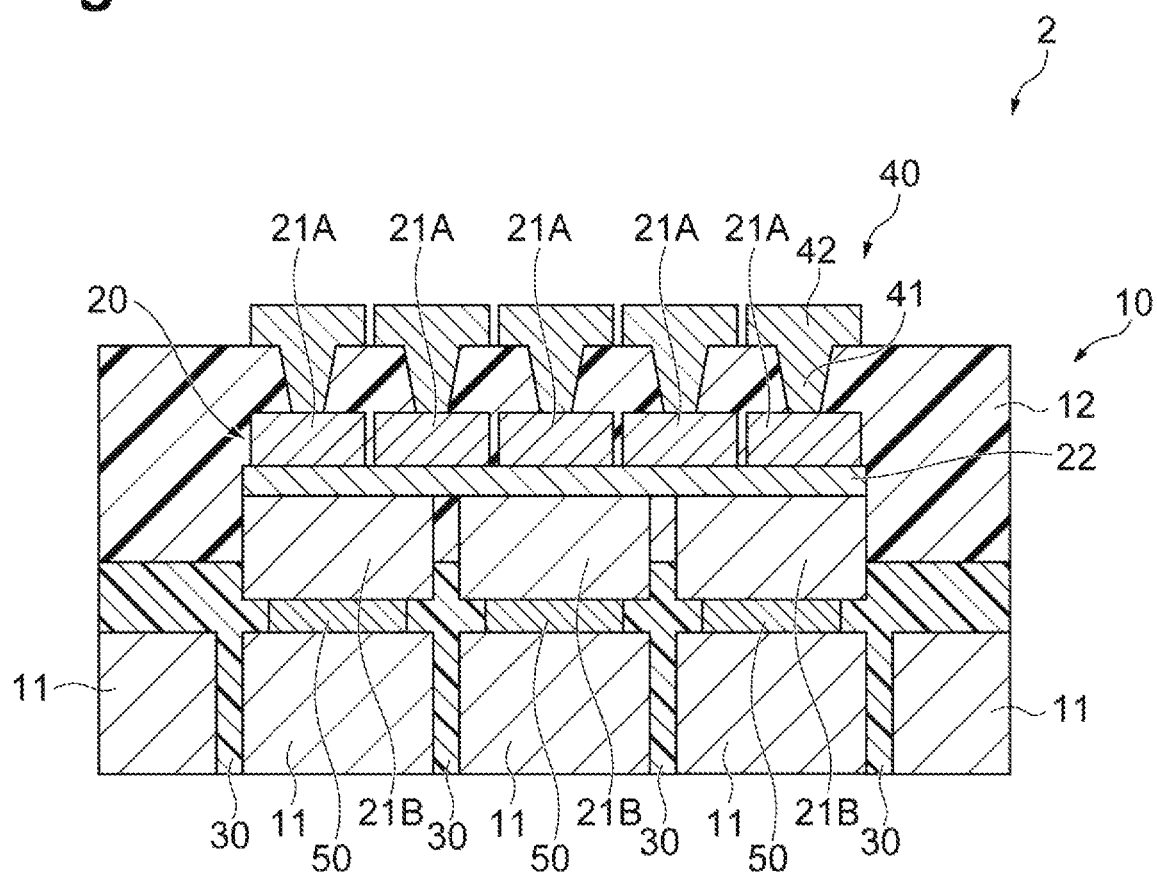
FIG. 5 is a schematic cross-sectional view of an electronic component embedded substrate according to a second embodiment of the present invention.

Next, with reference to FIG. 5, an electronic component embedded substrate 2 according to a second embodiment of the present invention will be described. FIG. 5 is a schematic cross-sectional view of an electronic component embedded substrate according to the second embodiment of the present invention. As with the electronic component embedded substrate 1, the electronic component embedded substrate 2 includes a substrate 10, an electronic component 20, and a stress relieving layer 30. The electronic component embedded substrate 2 is different from the electronic component embedded substrate 1 in that in the electronic component embedded substrate 2, the stress relieving layer 30 and the electronic component 20 are laminated in order on the wiring layer 11. In addition, since the electronic component 20 is laminated on the wiring layer 11, the wiring layer 11 is divided into a plurality of portions corresponding to the divided second electrode layer 21B of the electronic component 20. In the electronic component embedded substrate 2, the stress relieving layer 30 is provided such that the space between the second electrode layer 21B and the wiring layer 11 is filled with the stress relieving layer 30 and is provided such that the gaps between the divided wiring layers 11 is filled with the stress relieving layer 30. In the present embodiment, the second electrode layer 21B is divided into three portions. The wiring layer 11 is also divided into at least three portions corresponding to the respective second electrode layers 21B.

Between the second electrode layer 21B and the wiring layer 11, for example, a connection member 50 having conductivity is provided. The connection member 50 electrically connects the second electrode layer 21B and the wiring layer 11. Thus, the second electrode layer 21B of the electronic component 20 is electrically connected to an external electronic component, wiring, or the like through the connection member 50 and the wiring layer 11. As shown in FIG. 5, the connection member 50 is smaller than the second electrode layer 21B when viewed in the lamination direction, so that the stress relieving layer 30 is disposed on the end surface of the second electrode layer 21B. That is, the stress relieving layer 30 is provided such that the space between the second electrode layer 21B and the wiring layer 11 is filled with the stress relieving layer 30. The second electrode layer 21B and the wiring layer 11 may be directly and electrically connected without interposing the connection member 50. When the second electrode layer 21B and the wiring layer 11 are directly electrically connected, the shape of the second electrode layer 21B or the wiring layer 11 is changed from the shape shown in FIG. 5 so that the stress relieving layer 30 is provided between the second electrode layer 21B and the wiring layer 11 B Next, a method of manufacturing the electronic component embedded substrate 2 will be described with reference to FIGS. 6A to 8C. FIGS. 6A to 8C are diagrams for explaining a method of manufacturing the electronic component embedded substrate shown in FIG. 5. FIGS. 6A to 8C show a method of manufacturing one electronic component embedded substrate 2. Practically, after forming a plurality of electronic component embedded substrates 2 on one wafer, they are divided into respective electronic component embedded substrates 2. Therefore, FIGS. 6A to 8C are enlarged views of part of one wafer.

Figure 6A:
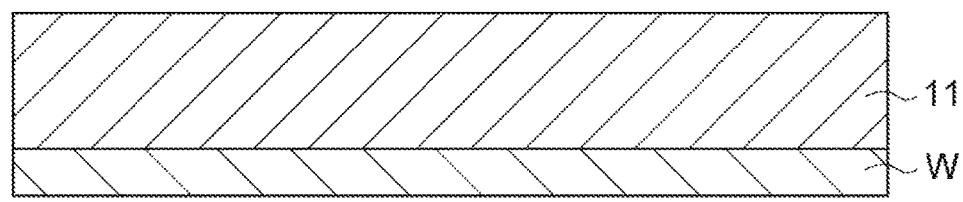
FIGS. 6A, 6B and 6C are views for explaining a method of manufacturing the electronic component embedded substrate shown in FIG. 5.

As shown in FIG. 6A, a wafer W as a base material is prepared, and a wiring layer 11 is formed on the wafer W. The material of the wafer W is not particularly limited, and for example, a Si wafer or the like can be used. The wiring layer 11 is formed by plating, for example. The wafer W on which the wiring layer 11 is formed may be prepared in advance.

Figure 6B:
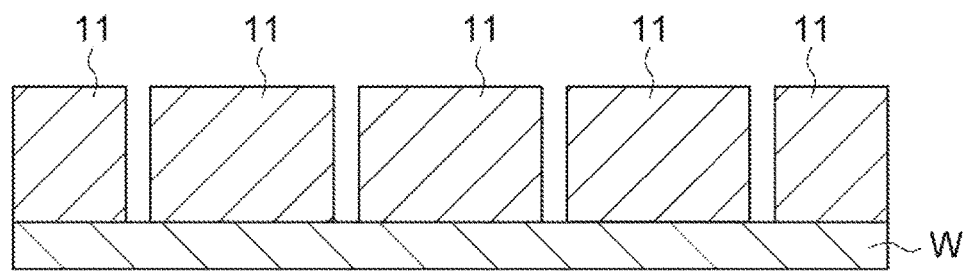

Next, as shown in FIG. 6B, the wiring layer 11 is divided into a plurality of parts by etching or the like. For example, a patterned photoresist or metal thin film can be used for etching the wiring layer 11 as a mask. Through this process, the wiring layer 11 is divided corresponding to the second electrode layer 21B of the electronic component 20 to be disposed later.

Figure 6C:
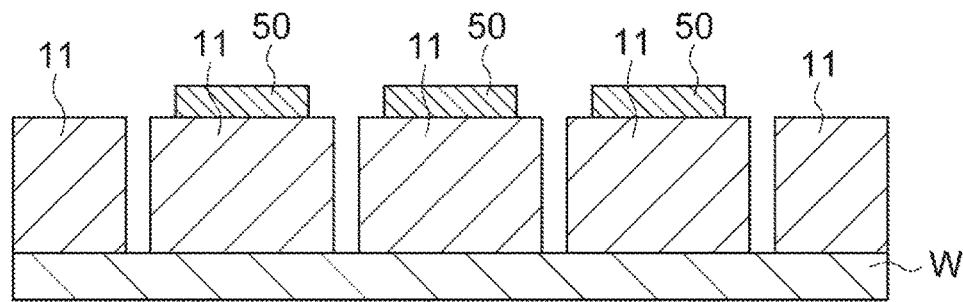

Next, as shown in FIG. 6C, a connection member 50 is formed on the divided wiring layer 11. Through this process, the connection member 50 is laminated on each of the divided wiring layers 11. Any material which has conductivity may be used as the material constituting the connection member 50.

Figure 7A:
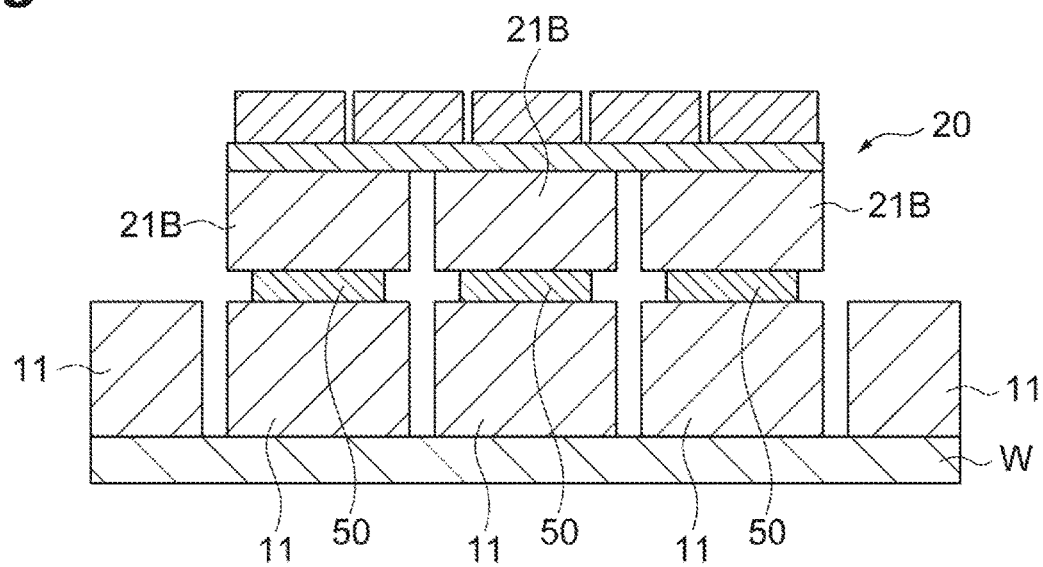
FIGS. 7A and 7B are views for explaining the method of manufacturing the electronic component embedded substrate shown in FIG. 5.

Next, as shown in FIG. 7A, the electronic component 20 is laminated on the connection member 50. The electronic component 20 is arranged in a state where the positions of the divided second electrode layers 21B are aligned so as to correspond to the positions of the respective connection members 50. Thus, the second electrode layer 21B is electrically connected to the connection member 50 and the wiring layer 11.

Figure 7B:
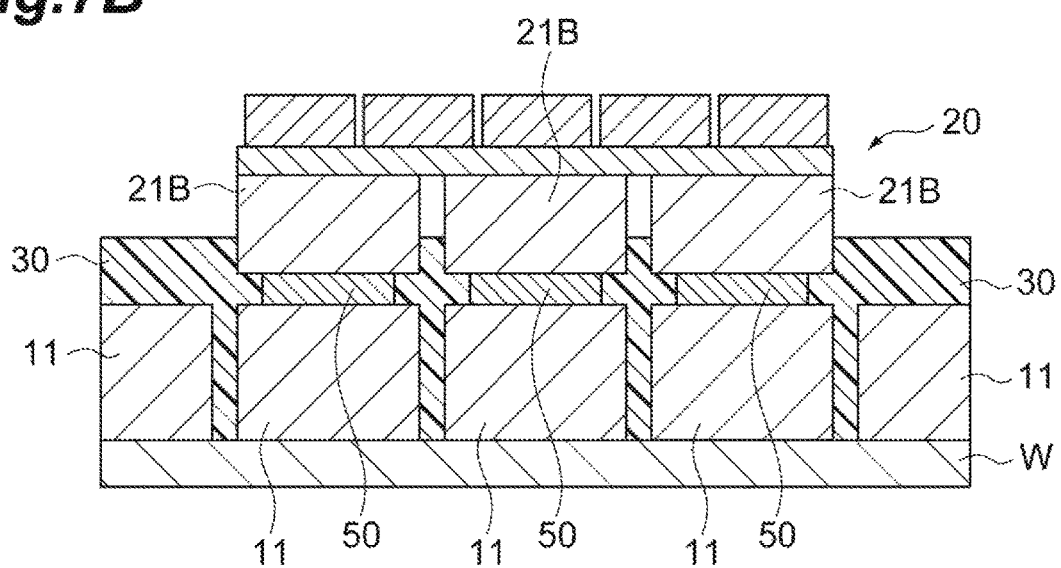

Next, as shown in FIG. 7B, the stress relieving layer 30 is formed. The stress relieving layer 30 is formed, for example, by applying a thermosetting resin or a photocurable resin in an uncured state and then curing it. Through this step, the gaps between the second electrode layers 21B and between the second electrode layer 21B and the wiring layer 11 is filled with the resin constituting the stress relieving layer 30. As a result, the stress relieving layer 30 and the electronic component 20 are sequentially laminated on the wiring layer 11.

Figure 8A:
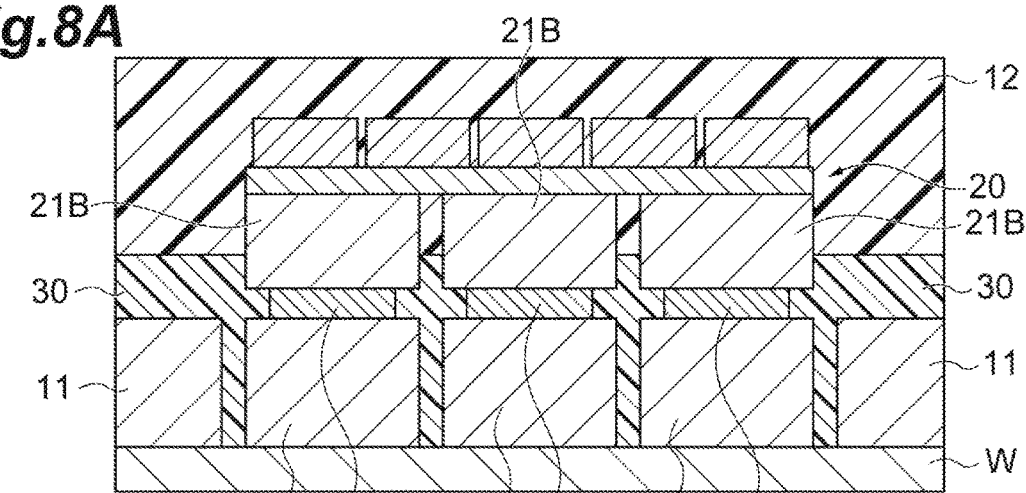
FIGS. 8A, 8B and 8C are views for explaining the method of manufacturing the electronic component embedded substrate shown in FIG. 5.

Next, as shown in FIG. 8A, the insulating layer 12 is formed. The insulating layer 12 is formed, for example, by applying a thermosetting resin in an uncured state and then heating and curing the applied resin. In addition, the insulating layer 12 may be formed by applying a photocurable resin in an uncured state and then applying light of a specific wavelength to cure it. Through this process, the insulating layer 12 is formed, and a gap between the electrodes of the electronic component 20 is filled with a resin constituting the insulating layer 12. As a result, the electronic component 20 and the stress relieving layer 30 are sealed by the insulating layer 12.

Figure 8B:
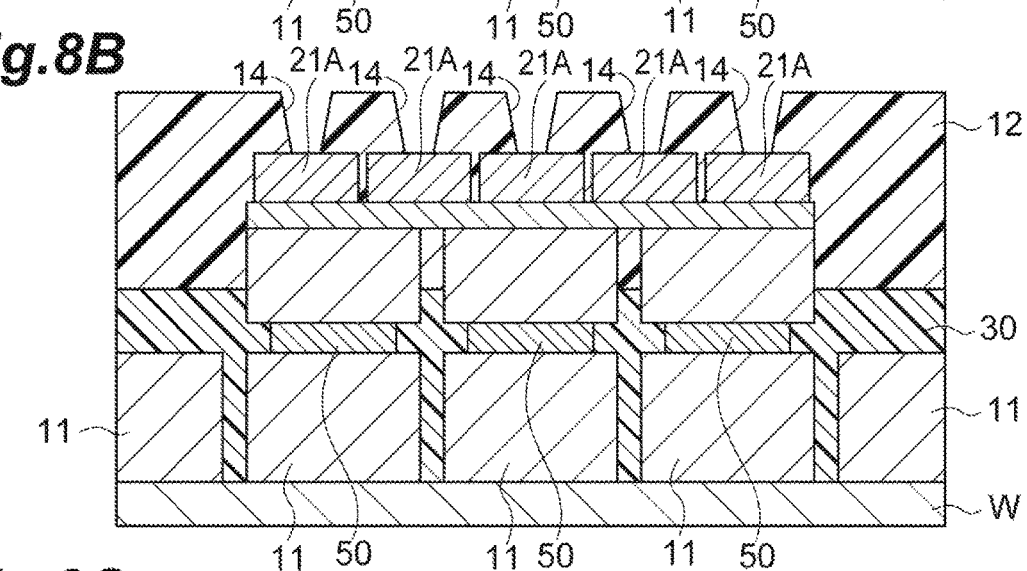

Next, as shown in FIG. 8B, a plurality of openings 14 corresponding to each of the divided first electrode layers 21A of the electronic component 20 are formed in the insulating layer 12. For example, dry etching or the like using the patterned photoresist as a mask can be used to form the opening 14. Through this step, each of the divided first electrode layers 21A of the electronic component 20 is exposed from the opening 14.

Figure 8C:
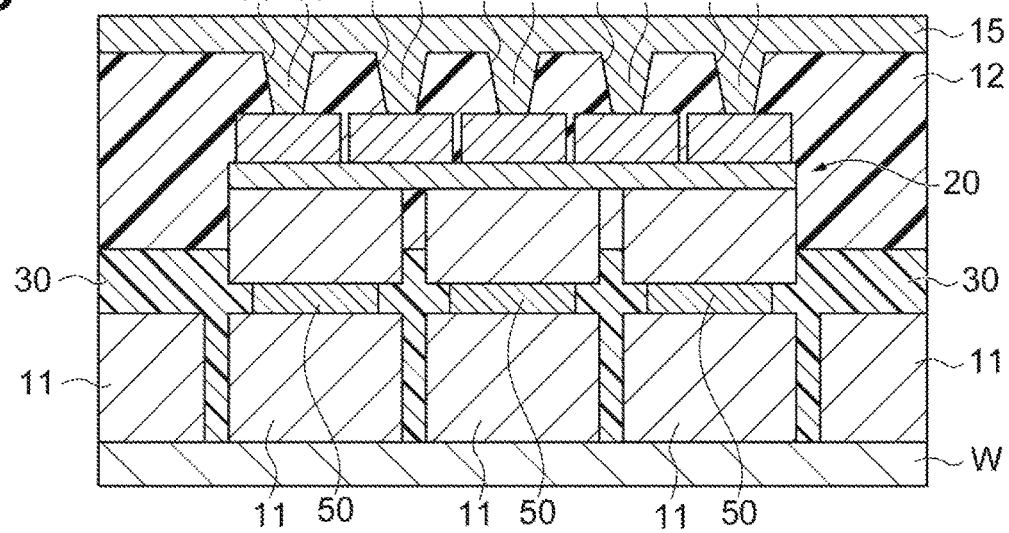

Next, as shown in FIG. 8C, a conductive layer 15 for forming the connection terminal 40 is formed. The conductive layer 15 is formed by plating, for example. Through this process, the conductive layer 15 is formed on the insulating layer 12, the plurality of openings 14 are filled with the conductive layer 15, and the via 41 of the connection terminal 40 is formed.

Finally, by patterning the conductive layer 15 by etching or the like, the terminal portions 42 of the plurality of connection terminals 40 are formed from the conductive layer 15. Through this process, a plurality of connection terminals 40 are formed. Thereafter, individualization is performed by dicing or the like, and the wafer W is removed, whereby the electronic component embedded substrate 2 as shown in FIG. 5 is obtained.

As described above, also in the electronic component embedded substrate 2, at least part of one end portion (the second electrode layer 21B) of the electronic component 20 positioned on the wiring layer 11 side in the lamination direction is in contact with the stress relieving layer 30. Since the Young's modulus of the stress relieving layer 30 is lower than the Young's modulus of the second electrode layer 21B positioned on the wiring layer 11 side, the external force applied to the electronic component 20 is relieved by the stress relieving layer 30. Therefore, even when the stress relieving layer 30 and the electronic component 20 have a structure in which the stress relieving layer 30 and the electronic component 20 are sequentially laminated on the wiring layer 11, deformation and the like of the dielectric layer 22 due to the influence of the external force on the electronic component 20 can be suppressed.

In the electronic component embedded substrate 2, the Young's modulus of the stress relieving layer 30 is preferably lower than the Young's modulus of the wiring layer 11. In this manner, when the Young's modulus of the stress relieving layer 30 is lower than the Young's modulus of the wiring layer 11, the external force applied to the electronic component 20 can be relieved. Therefore, it is possible to effectively suppress the deformation or the like of the dielectric layer 22 due to the influence of the external force on the electronic component 20.

Third Embodiment

Figure 9:
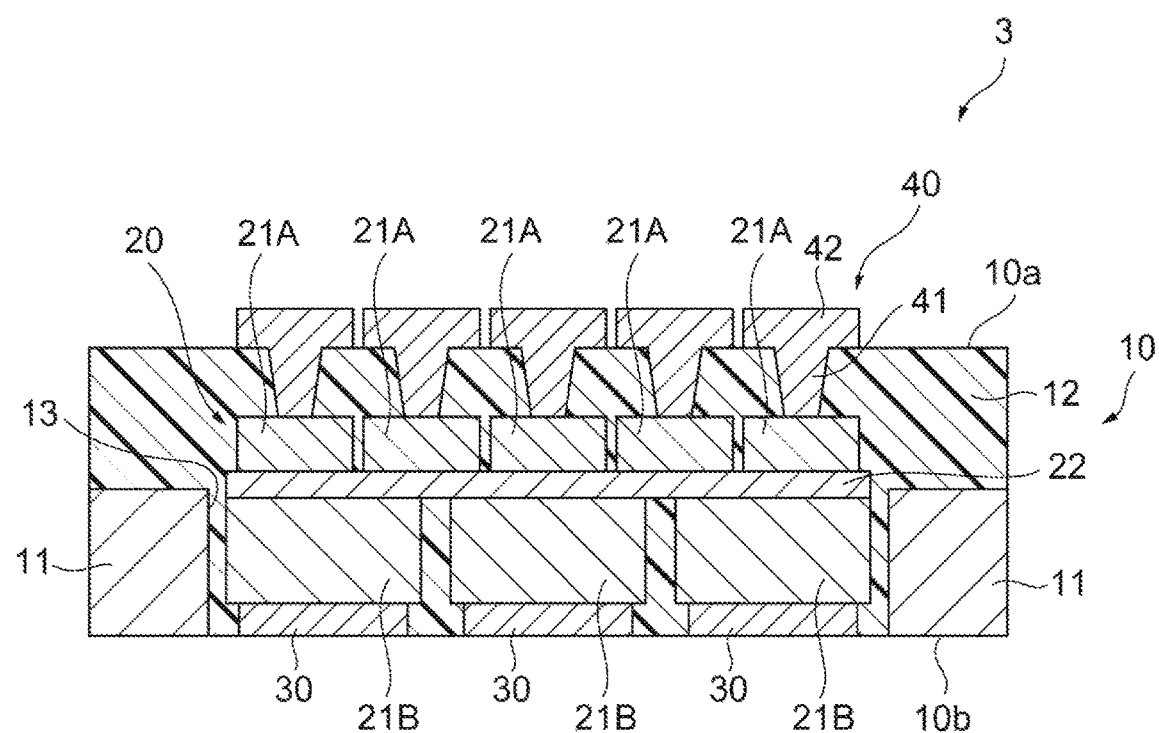
FIG. 9 is a cross-sectional view schematically showing an electronic component embedded substrate according to a third embodiment of the present invention.

Next, the electronic component embedded substrate 3 according to the second embodiment of the present invention will be described with reference to FIG. 9. FIG. 9 is a schematic cross-sectional view of an electronic component embedded substrate according to the third embodiment of the present invention. As shown in FIG. 9, the electronic component embedded substrate 3 includes a substrate 10, an electronic component 20 built in the substrate 10, and a stress relieving layer 30 (stress gap layer). The electronic component embedded substrate 3 is different from the electronic component embedded substrate 1 in that the electronic component embedded substrate 3 has the stress relieving layer 30 having conductivity. The stress relieving layer 30 is provided closer to the wiring layer 11 than the second electrode layer 21B of the electronic component 20 is. The stress relieving layer 30 is in contact with the second electrode layer 21B. In addition, the stress relieving layer 30 is disposed in the opening 13 of the wiring layer 11, and is exposed from the main surface 10b of the substrate 10 on the wiring layer 11 side.

The stress relieving layer 30 is made of a material having conductivity such as a solder alloy or silver (Ag), for example. Thus, the second electrode layer 21B is electrically connected to an external electronic component, wiring, or the like through the stress relieving layer 30. Also in the electronic component embedded substrate 3, from the viewpoint of improving the durability, it is preferable that the stress relieving layer 30 be not only electrically connected but also physically connected to the electronic component 20. Therefore, the stress relieving layer 30 is preferably a material whose hardness changes. From the above viewpoint, the solder alloy is preferably used as the stress relieving layer 30.

In the present embodiment, the stress relieving layer 30 is also divided into three corresponding to the second electrode layer 21B. In this way, the stress relieving layer 30 has a shape corresponding to the second electrode layer. In FIG. 9, the area of the stress relieving layer 30 is slightly smaller than the area of the second electrode layer 21B when viewed in the lamination direction. With this structure, it is possible to enhance the durability against the pressure in the longitudinal direction (lamination direction) applied from the stress relieving layer 30 of the electronic component embedded substrate 3 toward the dielectric layer 22. The stress relieving layer 30 is fixed to the second electrode layer 21B at a surface thereof. Since the stress relieving layer 30 is smaller than the second electrode layer 21B, it has a margin in the plane of the second electrode layer 21B. When the pressure in the longitudinal direction is applied, the stress relieving layer 30 deforms in the direction of the outer edge of the second electrode layer 21B and escapes the pressure in the longitudinal direction in the lateral direction (planar direction). At this time, since the stress relieving layer 30 has a margin in the plane of the second electrode layer 21B, the possibility of impairing the electrical characteristics due to the contact between the deformed stress relieving layers 30 is reduced. However, problems that can occur due to contact between the stress relieving layers 30 after deformation can also be prevented by the following two means; the Young's modulus of the stress relieving layer 30 described later is set to an appropriate value, and the gap between the electronic component 20 and the opening 13 is filled with the insulating layer 12. Therefore, as shown in FIG. 9, the area of the stress relieving layer 30 is not necessarily smaller than the area of the second electrode layer 21B when viewed in the lamination direction, and the area of the stress relieving layer 30 may be the same as the area of the second electrode layer 21B. The area of the stress relieving layer 30 may be larger than the area of the second electrode layer 21B.

The Young's modulus of the stress relieving layer 30 can be, for example, about 5 GPa to about 120 GPa The Young's modulus of the stress relieving layer 30 is made of a material having a Young's modulus lower than the Young's modulus of the second electrode layer 21B. The dimension of the stress relieving layer 30 in the lamination direction of the substrate 10 can be set to 2 μm to 50 μm.

Next, a method of manufacturing the electronic component embedded substrate 3 will be described with reference to FIGS. 10A to 12B. FIGS. 10A to 12B are views for explaining a method of manufacturing the electronic component embedded substrate shown in FIG. 9. FIGS. 10A to 12B show a method of manufacturing one electronic component embedded substrate 3. In practice, a plurality of electronic component embedded substrates 3 are formed on one wafer, and then divided into individual electronic component embedded substrates 3. Therefore, FIGS. 10A to 12B are enlarged views of part of one wafer.

Figure 10A:
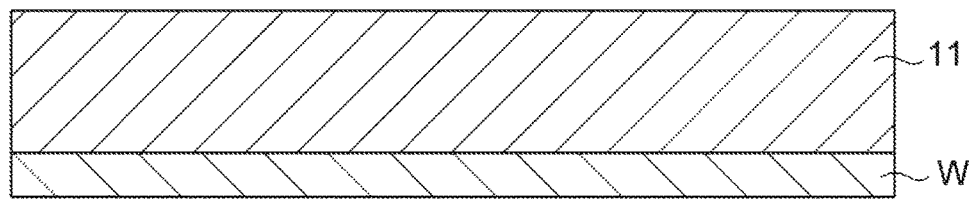
FIGS. 10A, 10B, and 10C are views for explaining a method of manufacturing the electronic component embedded substrate shown in FIG. 9.

First, as shown in FIG. 10A, a wafer W as a base material is prepared, and a wiring layer 11 is formed on the wafer W. The material of the wafer W is not particularly limited, and for example, a Si wafer or the like can be used. The wiring layer 11 is fainted by plating, for example. Note that the wafer W on which the wiring layer 11 is formed may be prepared in advance.

Figure 10B:
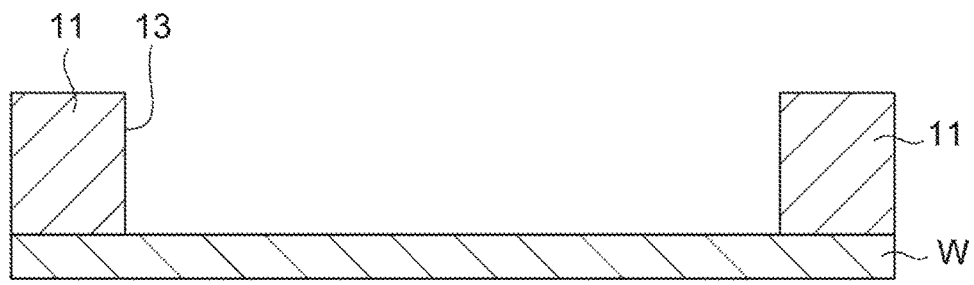

Next, as shown in FIG. 10B, an opening 13 in which the electronic component 20 is embedded is formed in the wiring layer 11. A general photolithography technique can be used to form the opening 13. Specifically, after applying a photoresist to the wiring layer 11, an actinic ray such as UV light is applied through a photomask. Next, the photoresist in the portion where the opening 13 is to be formed is removed by developing. Thereafter, the wiring layer 11 is etched using the photoresist as a mask. After etching of the wiring layer 11 is completed, the photoresist is removed. The material of the mask is not particularly limited, and a metal thin film such as chromium (Cr) or tungsten (W) may be used instead of the photoresist. The method of etching the wiring layer 11 is also not particularly limited, and a known wet etching process or a known dry etching process can be used.

Figure 10C:
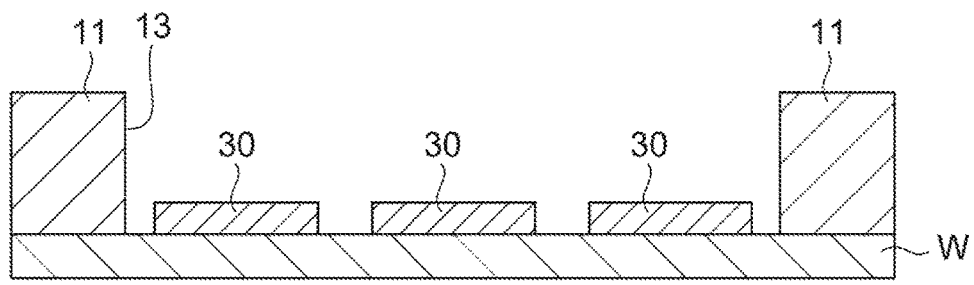

Next, as shown in FIG. 10C, the stress relieving layer 30 is formed in the opening 13. The stress relieving layer 30 is formed at a position corresponding to the second electrode layer 21B of the electronic component 20 to be embedded later. The stress relieving layer 30 can be formed by, for example, a printing method, a transfer method or a conductive film lamination method.

Figure 11A:
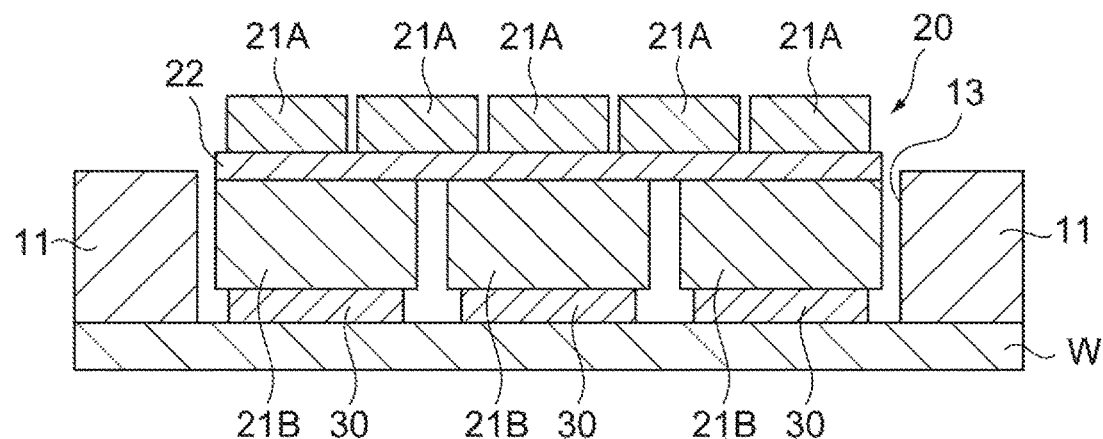
FIGS. 11A and 11B are views for explaining the method of manufacturing the electronic component embedded substrate shown in FIG. 9.

Next, as shown in FIG. 11A, the electronic component 20 is placed in the opening 13. The electronic component 20 including the first electrode layer 21A, the dielectric layer 22 and the second electrode layer 21B can be manufactured by a known method. The electronic component 20 is arranged in a state where the positions of the divided second electrode layers 21B are aligned so as to correspond to the positions of the respective stress relieving layers 30. Thus, the second electrode layer 21B is electrically connected to the stress relieving layer 30. As with a solder alloy, in the case where the stress relieving layer 30 is a material whose hardness changes, the electronic component 20 is disposed before the stress relieving layer 30 is cured, and the stress relieving layer 30 is cured, whereby the electronic component 20 and the stress relieving layer 30 can be physically connected.

Figure 11B:
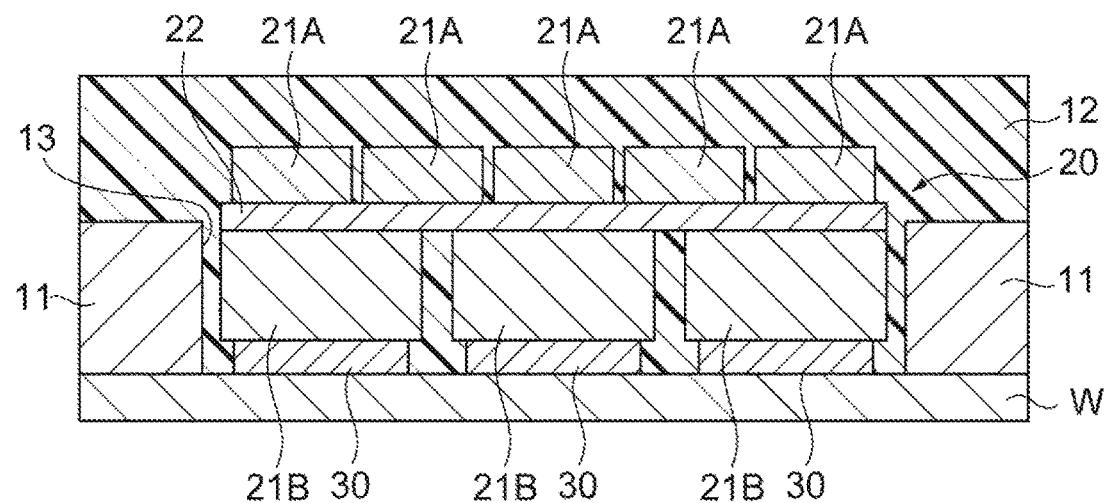

Next, as shown in FIG. 11B, the insulating layer 12 is formed on the wiring layer 11. The insulating layer 12 is formed, for example, by applying a thermosetting resin in an uncured state and then heating and curing the applied resin. In addition, the insulating layer 12 may be formed by applying a photocurable resin in an uncured state and then applying light of a specific wavelength to cure it. Through this process, the insulating layer 12 is laminated on the wiring layer 11, the opening 13 and a space between the electrodes are filled with the resin constituting the insulating layer 12, and the electronic component 20 and the stress relieving layer 30 are sealed by the insulating layer 12.

Figure 12A:
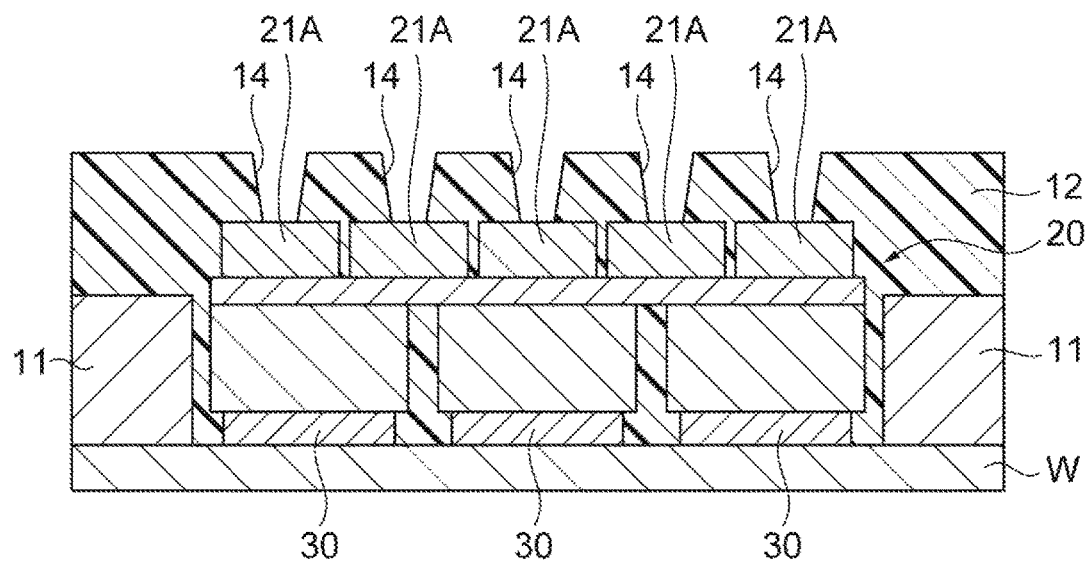
FIGS. 12A and 12B are views for explaining the method of manufacturing the electronic component embedded substrate shown in FIG. 9.

Next, as shown in FIG. 12A, a plurality of openings 14 corresponding to the first electrode layers 21A of the electronic component 20 are formed in the insulating layer 12. For example, dry etching using a patterned photoresist as a mask can be used to form the opening 14. Through this step, each of the first electrode layers 21A of the electronic component 20 is exposed from the opening 14.

Figure 12B:
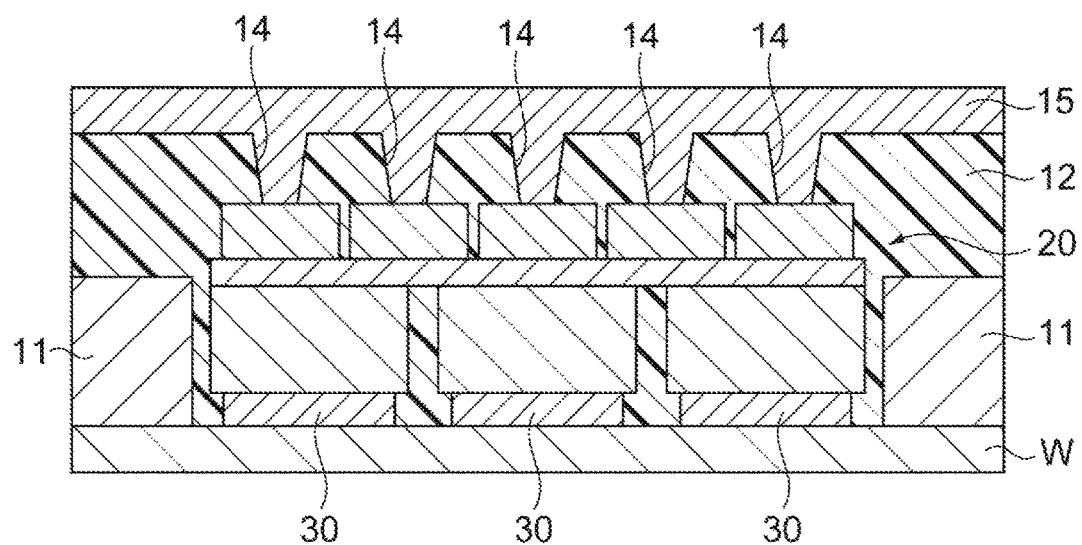

Next, as shown in FIG. 12B, a conductive layer 15 for forming the connection terminal 40 is formed. The conductive layer 15 is formed by plating, for example. Through this process, the conductive layer 15 is formed on the insulating layer 12, the plurality of openings 14 are filled with the conductive layer 15, and the vias 41 of the plurality of connection terminals 40 are formed.

Finally, the conductive layer 15 is patterned by etching or the like, so that the terminal portions 42 of the plurality of connection terminals 40 are formed from the conductive layer 15. Through this process, a plurality of connection terminals 40 are formed. Thereafter, individualization is performed by dicing or the like, and the wafer W is removed, whereby the electronic component embedded substrate 3 as shown in FIG. 9 is obtained.

As described above, also in the electronic component embedded substrate 3, the stress relieving layer 30 is provided on the second electrode layer 21B on the wiring layer 11 side wherein the second electrode layer 21B is positioned on the wiring layer 11 side of the substrate 10. Since the Young's modulus of this stress relieving layer 30 is lower than the Young's modulus of the second electrode layer 21B, the external force applied to the electronic component 20 is relieved by the stress relieving layer 30. Therefore, deformation of the dielectric layer 22 of the electronic component 20 due to external force can be suppressed. In addition, since the stress relieving layer 30 has conductivity, deformation of the dielectric layer 22 of the electronic component 20 due to external force can be suppressed while maintaining electrical connection with the second electrode layer 21B.

The electronic component embedded substrate 3 includes the electronic component 20 whose height is reduced as described above. In this way, when the height of the electronic component 20 is reduced, the dielectric layer 22 is greatly affected by the external force. In particular, it is considered probable that since the wiring layer 11 has a higher Young's modulus than the insulating layer 12, the external force from the wiring layer 11 side has directly affecting the dielectric layer 22. Therefore, of the pair of electrode layers sandwiching the dielectric layer 22, the stress relieving layer 30 is provided closer to the wiring layer 11 (specifically, exposed surface 10b) than the second electrode layer 21B provided on the wiring layer 11 side is, so that in particular, when an external force is applied along the lamination direction of the substrate 10 and the electronic component 20, the stress relieving layer 30 can preferably relieve the external force. Therefore, it is possible to suppress deformation of the dielectric layer 22 due to an external force at the time of manufacturing and handling the electronic component embedded substrate 3.

When the Young's modulus of the stress relieving layer 30 is lower than the Young's modulus of the second electrode layer 21B, deformation of the electronic component 20 due to external force can be suppressed. The difference between the Young's modulus of the stress relieving layer 30 and the Young's modulus of the second electrode layer 21B is preferably 50 GPa or more. As described above, the difference in Young's modulus is 50 GPa or more, so that it is possible to more preferably relieve the external force by the stress relieving layer 30.

At least part of the electronic component 20 is embedded in the opening 13 of the wiring layer 11, and the stress relieving layer 30 is exposed from the wiring layer 11 side (the main surface 10b of the substrate 10) of the substrate 10. Whereby, the second electrode layer 21B and the external component can be electrically connected via the stress relieving layer 30. Since at least part of the electronic component 20 is embedded in the wiring layer 11, the dimension in the lamination direction of the electronic component embedded substrate 3 can be reduced.

Fourth Embodiment

Figure 13:
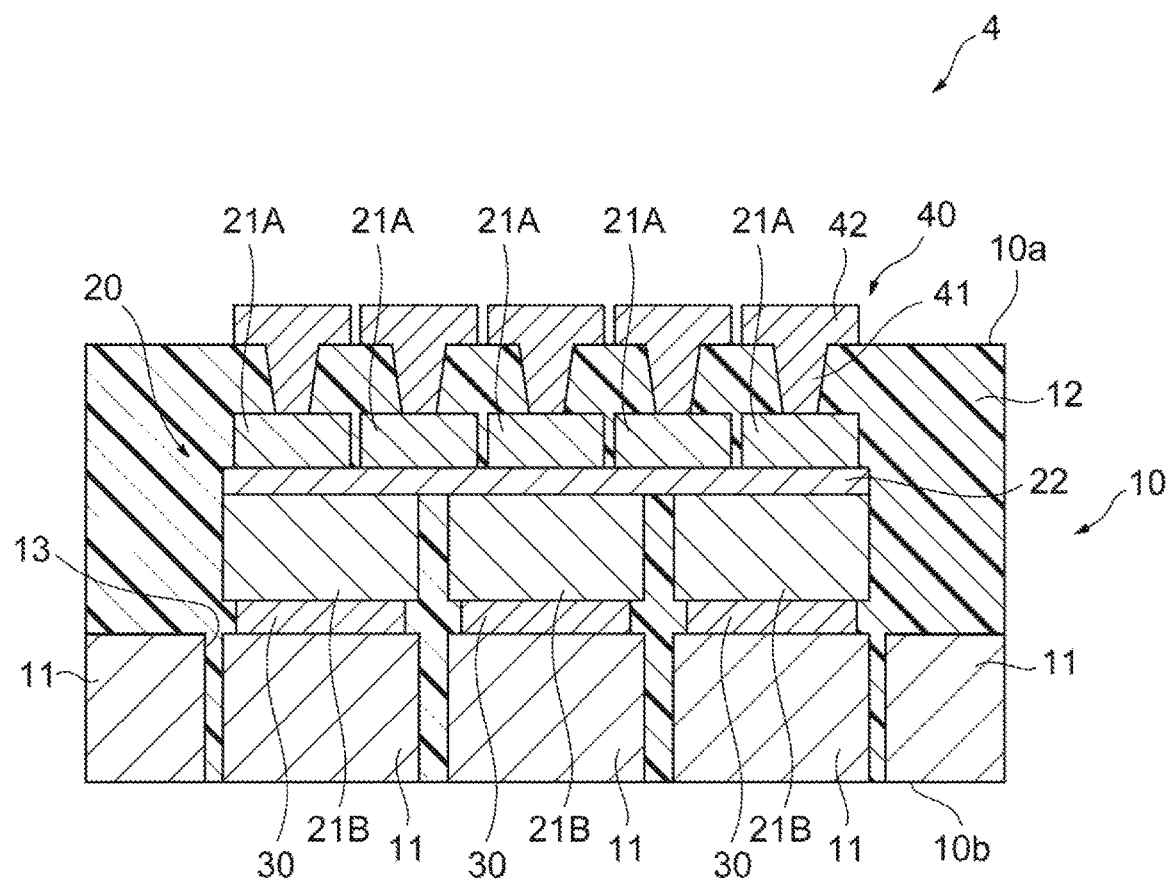
FIG. 13 is a schematic cross-sectional view of an electronic component embedded substrate according to a fourth embodiment of the present invention.

Next, an electronic component embedded substrate 4 according to a fourth embodiment of the present invention will be described with reference to FIG. 13. FIG. 13 is a schematic cross-sectional view of an electronic component embedded substrate according to the fourth embodiment of the present invention. As with the electronic component embedded substrate 3, the electronic component embedded substrate 4 includes a substrate 10, an electronic component 20, and a stress relieving layer 30 having conductivity. The electronic component embedded substrate 4 is different from the electronic component embedded substrate 3 in that in the electronic component embedded substrate 4, the stress relieving layer 30 and the electronic component 20 are sequentially laminated on the wiring layer 11, and corresponding to the divided second electrode layer 21B of the electronic component 20, the wiring layer 11 is divided into a plurality of portions In the present embodiment, the second electrode layer 21B is divided into three portions, and the wiring layer 11 is also divided into at least three corresponding to the respective second electrode layers 21B. Thus, the second electrode layer 21B of the electronic component 20 is electrically connected to an external electronic component, wiring, or the like via the stress relieving layer 30 and the wiring layer 11.

Subsequently, a method of manufacturing the electronic component embedded substrate 4 will be described with reference to FIGS. 14A to 16B. FIGS. 14A to 16B are views for explaining a method of manufacturing the electronic component embedded substrate shown in FIG. 13. FIGS. 14A to 16B show a method of manufacturing one electronic component embedded substrate 4. Practically, after forming a plurality of electronic component embedded substrates 4 on one wafer, they are divided into respective electronic component embedded substrates 4. Therefore, FIGS. 14A to 16B are enlarged views of part of one wafer.

Figure 14A:
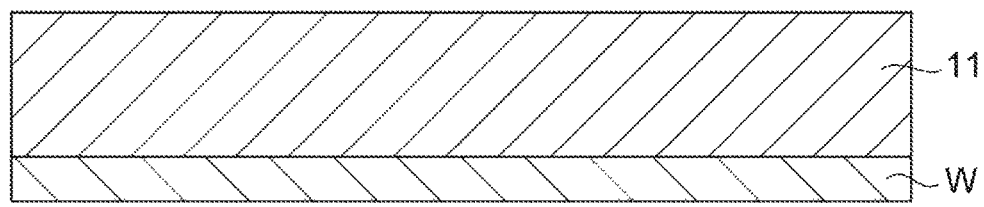
FIGS. 14A, 14B and 14C are views for explaining a method of manufacturing the electronic component embedded substrate shown in FIG. 13.

As shown in FIG. 14A, a wafer W as a base material is prepared, and a wiring layer 11 is formed on the wafer W. The material of the wafer W is not particularly limited, and for example, a Si wafer or the like can be used. The wiring layer 11 is formed by plating, for example. The wafer W on which the wiring layer 11 is formed may be prepared in advance.

Figure 14B:
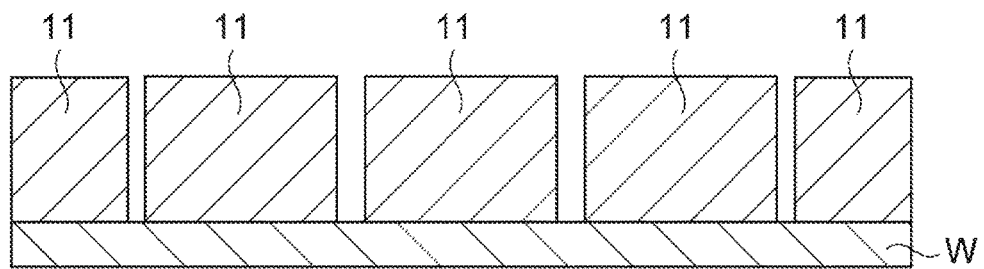

Next, as shown in FIG. 14B, the wiring layer 11 is divided into a plurality of parts by etching or the like. For example, a patterned photoresist or metal thin film can be used for etching the wiring layer 11 as a mask. Through this process, the wiring layer 11 is divided corresponding to the second electrode layer 21B of the electronic component 20 to be disposed later.

Figure 14C:
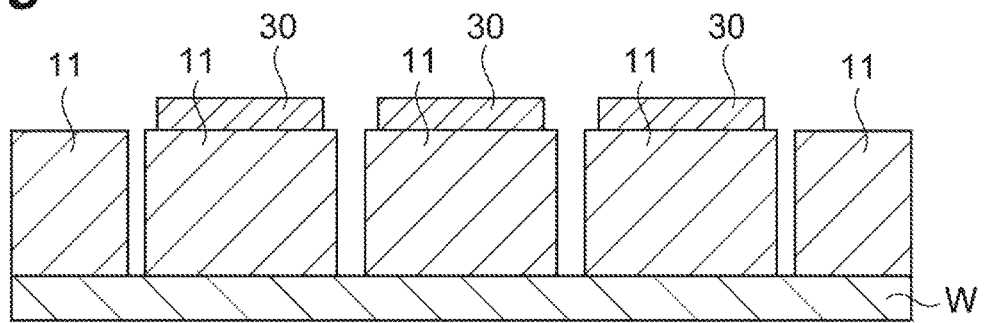

Next, as shown in FIG. 14C, a stress relieving layer 30 is formed on the divided wiring layer 11. The stress relieving layer 30 can be formed by, for example, a printing method, a transfer method or a conductive film lamination method. Through this process, the stress relieving layer 30 is laminated on each of the divided wiring layers 11.

Figure 15A:
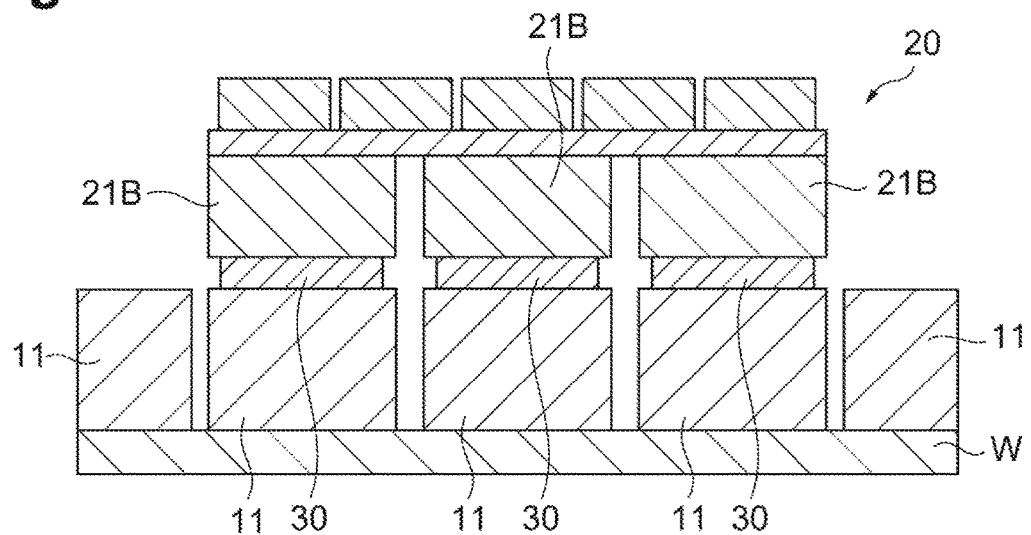
FIGS. 15A and 15B are views for explaining the method of manufacturing the electronic component embedded substrate shown in FIG. 13.

Next, as shown in FIG. 15A, the electronic component 20 is laminated on the stress relieving layer 30. The electronic component 20 is arranged in a state where the positions of the divided second electrode layers 21B are aligned so as to correspond to the positions of the respective stress relieving layers 30. Thus, the second electrode layer 21B is electrically connected to the stress relieving layer 30.

Figure 15B:
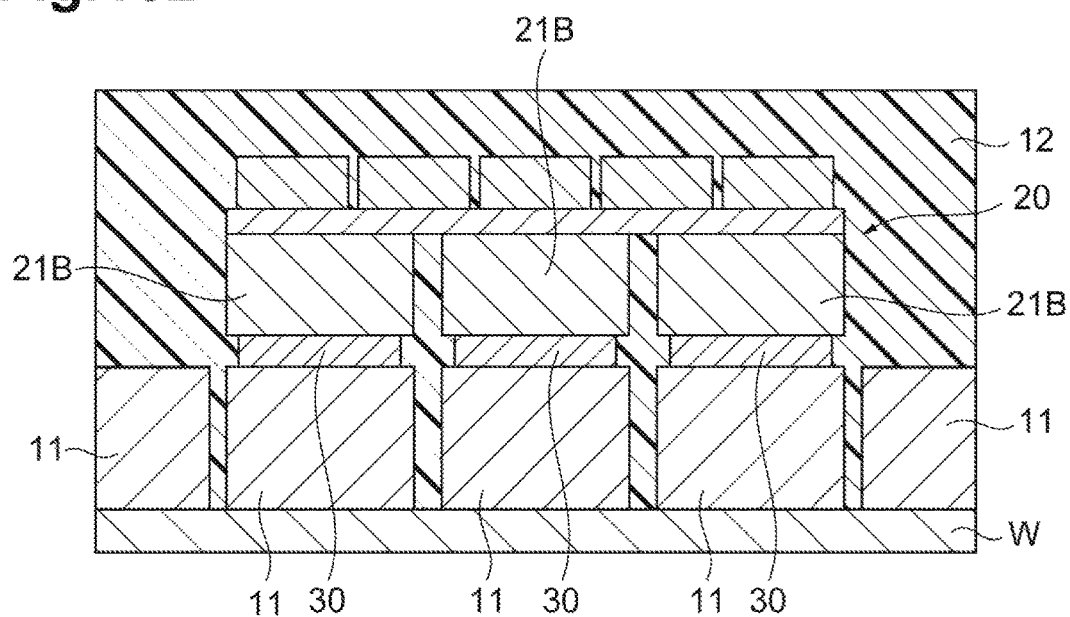

Next, as shown in FIG. 15B, the insulating layer 12 is formed. The insulating layer 12 is formed, for example, by applying a thermosetting resin or a photocurable resin in an uncured state and then curing it. The insulating layer 12 may be formed by applying a photocurable resin in an uncured state and then apply light of a specific wavelength to cure it. Through this process, the insulating layer 12 is formed, and gaps between the divided wiring layers 11 and between the electrodes of the electronic component 20 are filled with a resin constituting the insulating layer 12. As a result, the stress relieving layer 30 and the electronic component 20 are sealed by the insulating layer 12.

Figure 16A:
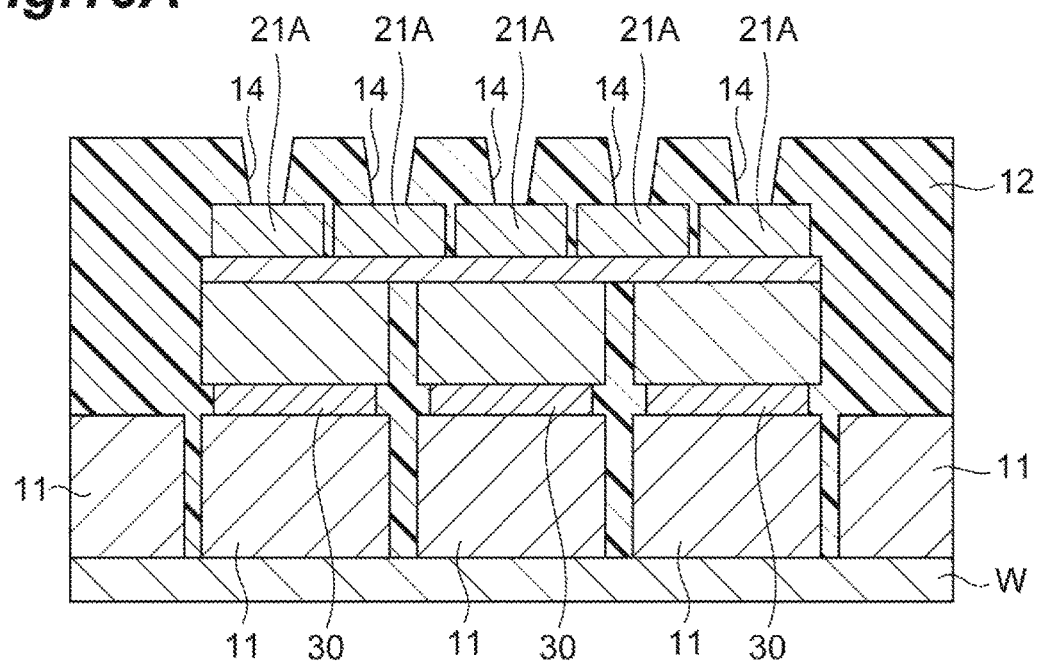
FIGS. 16A and 16B are views for explaining the method of manufacturing the electronic component embedded substrate shown in FIG. 13.

Next, as shown in FIG. 16A, a plurality of openings 14 corresponding to each of the divided first electrode layers 21A of the electronic component 20 are formed in the insulating layer 12. For example, dry etching or the like using the patterned photoresist as a mask can be used to form the opening 14. Through this step, each of the divided first electrode layers 21A of the electronic component 20 is exposed from the opening 14.

Figure 16B:
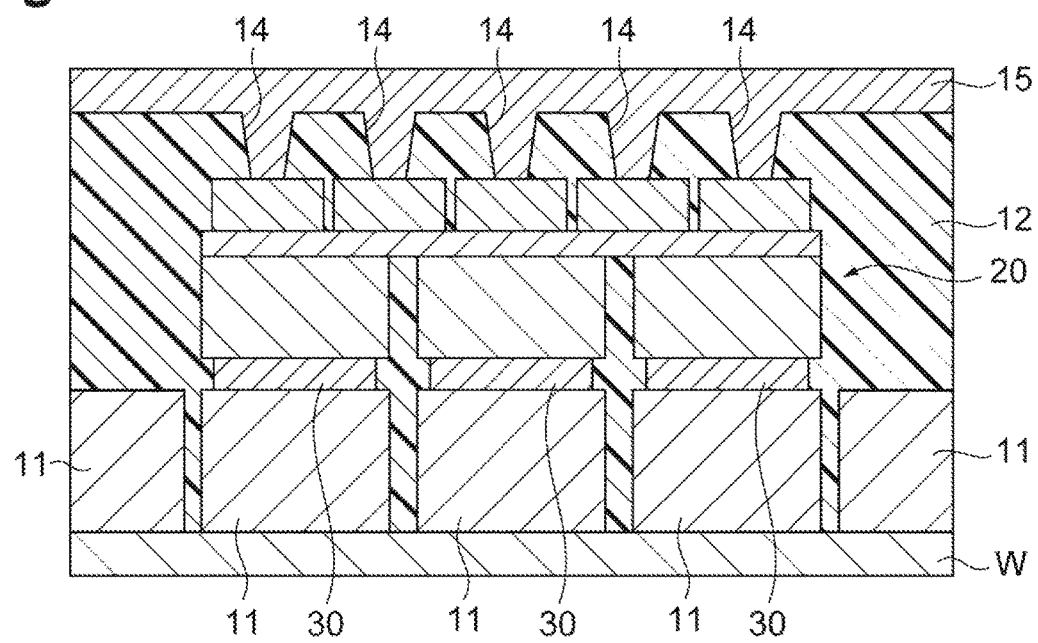

Next, as shown in FIG. 16B, a conductive layer 15 for forming the connection terminal 40 is formed. The conductive layer 15 is formed by plating, for example. Through this process, the conductive layer 15 is formed on the insulating layer 12, the plurality of openings 14 are filled with the conductive layer 15, and the via 41 of the connection terminal 40 is formed.

Finally, by patterning the conductive layer 15 by etching or the like, the terminal portions 42 of the plurality of connection terminals 40 are formed from the conductive layer 15. Through this process, a plurality of connection terminals 40 are formed. Thereafter, individualization is performed by dicing or the like, and the wafer W is removed, whereby the electronic component embedded substrate 2 as shown in FIG. 13 is obtained.

As described above, in the electronic component embedded substrate 4, the stress relieving layer 30 is provided on the wiring layer 11 side (specifically, exposed surface 10b side) of the second electrode layer 21B positioned on the wiring layer 11 side. Since the Young's modulus of the stress relieving layer 30 is lower than the Young's modulus of the second electrode layer 21B, the external force applied to the electronic component 20 is relieved by the stress relieving layer 30. Therefore, deformation of the dielectric layer 22 of the electronic component 20 due to external force can be suppressed. In addition, since the stress relieving layer 30 has conductivity, deformation of the dielectric layer 22 of the electronic component 20 due to external force can be suppressed while maintaining electrical connection with the second electrode layer 21B.

In addition, the stress relieving layer 30 and the electronic component 20 are sequentially laminated on the wiring layer 11, and the stress relieving layer 30 is in contact with the wiring layer 11. Thus, the second electrode layer 21B and the wiring layer 11 can be electrically connected via the stress relieving layer 30.

In the electronic component embedded substrate 4, the Young's modulus of the stress relieving layer 30 is preferably lower than the Young's modulus of the wiring layer 11. In this manner, when the Young's modulus of the stress relieving layer 30 is lower than the Young's modulus of the wiring layer 11, the external force applied to the electronic component 20 can be relieved. Therefore, deformation of the dielectric layer 22 of the electronic component 20 due to external force can be effectively suppressed.

Although the embodiments of the present invention have been described above, the present invention is not limited to the above embodiment, and various modifications can be made.

Figure 17:
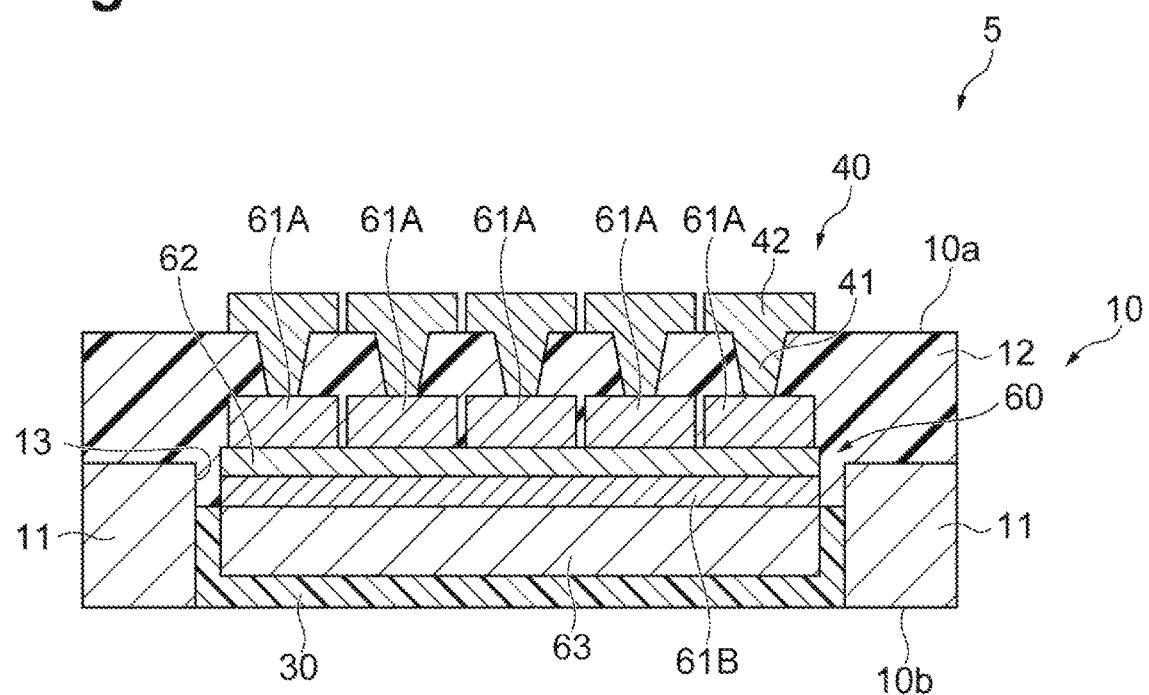
FIG. 17 is a schematic cross-sectional view of a modification example of the electronic component embedded substrate shown in FIG. 1.

For example, the electronic component built in the electronic component embedded substrate is not limited to the electronic component 20, and may have a structure different from the electronic component 20. FIG. 17 is a schematic cross-sectional view of an electronic component embedded substrate 5 according to a modified example of the electronic component embedded substrate 1 shown in FIG. 1. As shown in FIG. 17, the electronic component embedded substrate 5 is different from the electronic component embedded substrate 1 in that the electronic component embedded substrate 5 incorporates an electronic component 60 in place of the electronic component 20, and has no opening in its stress relieving layer 30

The electronic component 60 includes a pair of electrode layers (a first electrode layer 61A, and a second electrode layer 61B) and a dielectric layer 62 disposed between the first electrode layer 61A and the second electrode layer 61B, and further includes a base material layer 63. The second electrode layer 61B, the dielectric layer 62, and the first electrode layer 61A are laminated on the base material layer 63 in this order. The base material layer 63 is made of, for example, a semiconductor material such as silicon (Si). In the electronic component 60, the second electrode layer 61B is electrically connected to an external electronic component, wiring, or the like from the insulating layer 12 side instead of the wiring layer 11 side. In the electronic component embedded substrate 5 in which the electronic component 60 is built, the stress relieving layer 30 is provided so as to cover the end portion of the electronic component 60 on the wiring layer 11 side, that is, the entire base material layer 63. In the electronic component embedded substrate 5, it is unnecessary to ensure electrical connection with the second electrode layer 61B of the electronic component 60 on the wiring layer 11 side (specifically, exposed surface 10b side), and the stress relieving layer 30 does not need to have an opening for electrical connection of the second electrode layer 61B. Thus, it is possible to increase the contact area between the stress relieving layer 30 and the electronic component 60. Therefore, it is possible to effectively suppress the deformation and the like of the dielectric layer 62 due to the influence of the external force on the electronic component 60.

Figure 18:
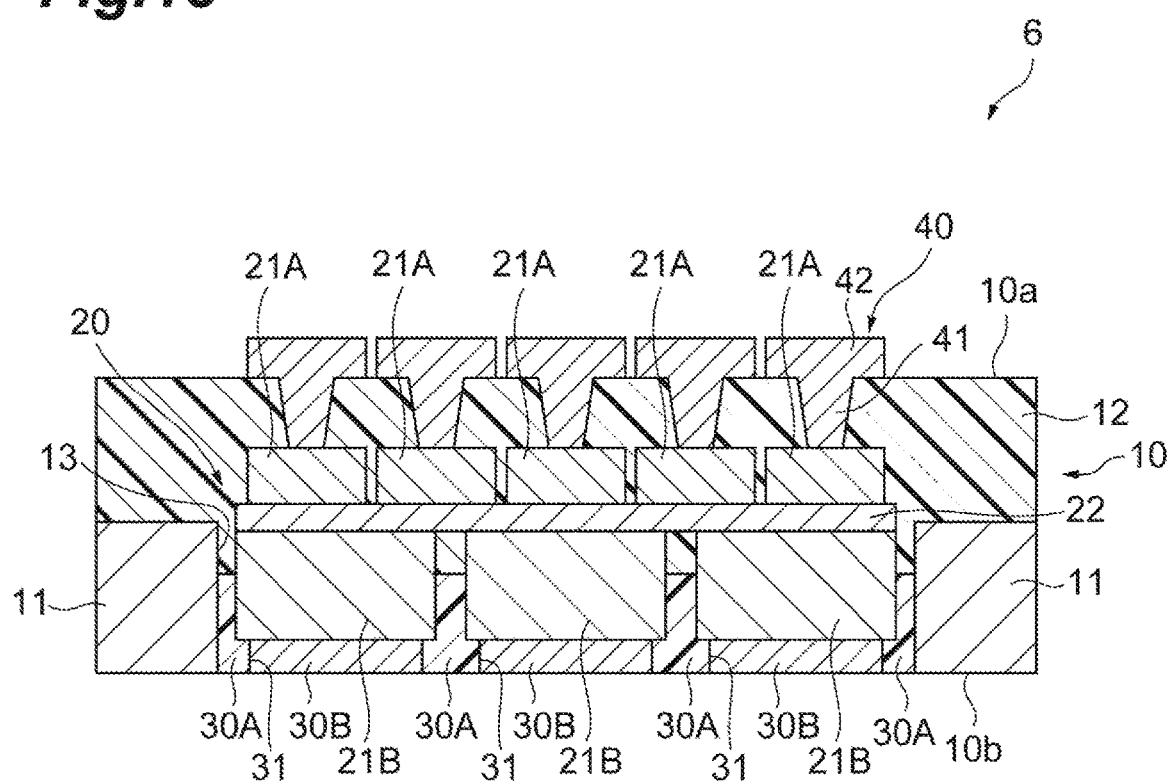
FIG. 18 is a schematic cross-sectional view of another modification example of the electronic component embedded substrate shown in FIG. 1.

In addition, the stress relieving layer 30 of the electronic component embedded substrate may include the first stress relieving layer 30A having insulating properties and the second stress relieving layer 30B having conductivity for the purpose of further relieving the external force. FIG. 18 is a schematic cross-sectional view of an electronic component embedded substrate 6 according to a modified example of the electronic component embedded substrate 1 shown in FIG. 1. As shown in FIG. 18, the electronic component embedded substrate 6 is different from the electronic component embedded substrate 1 in that the electronic component embedded substrate 6 is in contact with at least part of one end portion (second electrode layer 21B) of the electronic component 20 and includes the first stress relieving layer 30A having insulating properties and the second stress relieving layer 30B having conductivity and provided on the wiring layer 11 side of the second electrode layer 21B, that is, in the opening 31 of the first stress relieving layer 30A. Specifically, the first stress relieving layer 30A is in contact with the end surface of the second electrode layer 21B in the lamination direction and the side surface that intersects this end surface and is continuous with the end surface. The first stress relieving layer 30A is provided between the divided second electrode layers 21B and between the second electrode layer 21B and the wiring layer 11. One end of the second stress relieving layer 30B is in contact with the second electrode layer 21B and the other end is exposed from the main surface 10b of the substrate 10. As a result, the second electrode layer 21B of the electronic component 20 can be electrically connected to external electronic components, wiring, etc. through the second stress relieving layer 30B.

As with the stress relieving layer 30 (the stress relieving layer 30 having insulating properties) in the electronic component embedded substrate 1 and the electronic component embedded substrate 2, the material of the first stress relieving layer 30A preferably includes for example, a nonconductive resin (Non Conductive Paste: NCP) or the like. The Young's modulus of the first stress relieving layer 30A can be, for example, 0.1 GPa to 50 GPa.

As with the stress relieving layer 30 (the stress relieving layer 30 having conductivity properties) in the electronic component embedded substrate 3 and the electronic component embedded substrate 4, the material of the second stress relieving layer 30B is made of a material having conductivity such as a solder alloy or silver (Ag), for example. The Young's modulus of the material constituting the second stress relieving layer 30B is lower than the Young's modulus of the second electrode layer 21B, and can be set to 5 GPa to 120 GPa, for example. Furthermore, it is preferable that the Young's modulus of the material constituting the second stress relieving layer 30B be lower than the Young's modulus of the material constituting the wiring layer 11. Further, the thickness of the second stress relieving layer 30B can be, for example, about 2 µm to 50 µm.

As described above, the stress relieving layer 30 includes the first stress relieving layer 30A and the second stress relieving layer 30B, and the contact area between the stress relieving layer 30 and the electronic component 20 thereby can be increased. Specifically, as shown in FIG. 18, the first stress relieving layer 30A can be disposed at a place where insulation is required, such as a place between the second electrode layer 21B on the wiring layer 11 side and the wiring layer 11. The second stress relieving layer 30B can be disposed in a place where conductivity is required, such that the second stress relieving layer 30B is disposed closer to the wiring layer 11 (specifically, exposed surface 10b) than the second electrode layer 21B positioned on the wiring layer 11 side is. In this way, since the contact area between the stress relieving layer 30 and the electronic component 20 can be increased, it is possible to more effectively suppress the deformation and the like of the dielectric layer 22 due to the influence of the external force on the electronic component 20 while the electrical connection between the second electrode layer 21B and the external electronic component or the like is secured.

Figure 19:
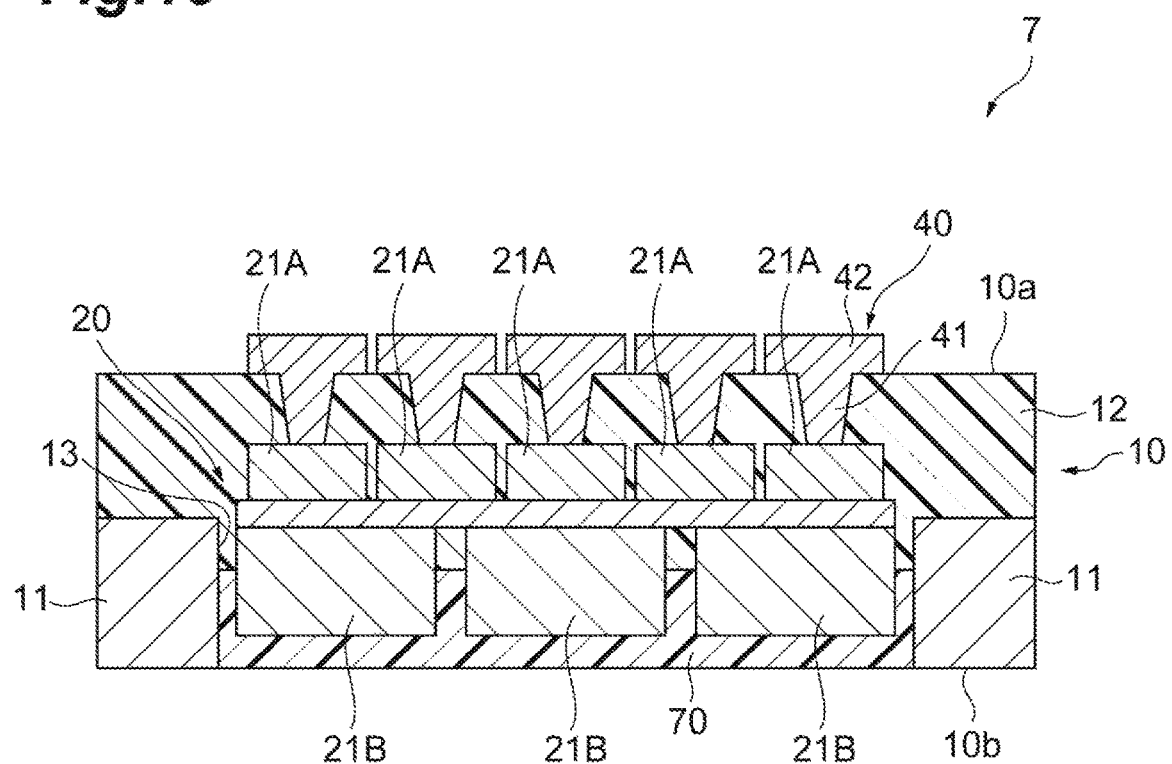
FIG. 19 is a schematic cross-sectional view of a modification example of the electronic component embedded substrate shown in FIG. 18.

Further, even in the case where the electronic component 20 has the plurality of second electrode layers 21B, a further stress relieving layer may be provided so as to cover all the end portions of the electronic component 20 on the wiring layer 11 side. FIG. 19 is a schematic cross-sectional view of an electronic component embedded substrate 7 according to a modified example of the electronic component embedded substrate 6 shown in FIG. 18. As shown in FIG. 19, the electronic component embedded substrate 7 is different from the electronic component embedded substrate 6 in that in the electronic component embedded substrate 7, with one type of stress relieving layer 70, insulation is secured between the plurality of second electrode layers 21B and between the second electrode layer 21B and the wiring layer 11, and electrical connection between the second electrode layer 21B and an external electronic component or the like is secured For example, the stress relieving layer 70 may be an anisotropic conductive film having conductivity in the lamination direction and having insulation properties in a direction crossing the lamination direction. In such an electronic component embedded substrate 7, since the contact area between the stress relieving layer 70 and the electronic component 20 can be increased, it is possible to more effectively suppress deformation and the like of the dielectric layer 22 due to the influence of the external force on the electronic component 20 while securing the electrical connection between the second electrode layer 21B and the external electronic component or the like.

In the above embodiment, the stress relieving layer 30 is provided up to a vertical position overlapping with the second electrode layer 21B of the electronic component 20 in the lamination direction of the substrate 10. The height (thickness) of the stress relieving layer 30 can be appropriately changed within a range where part of the end portion of the first electrode layer 21A of the electronic component 20 is in contact with the insulating layer 12. For example, the stress relieving layer 30 may be thicker than the wiring layer 11, or not overlapped with the second electrode layer 21B but provided so as to contact only the end surface of the second electrode layer 21B in the lamination direction. From the viewpoint of easing the external force, it is preferable that the stress relieving layer 30 be provided thick, and for example, it may be provided up to a vertical position overlapping with the first electrode layer 21A.

Further, the stress relieving layer 30 may be in contact with at least part of the end portion of the electronic component 20 on the wiring layer 11 side. In the above embodiment, a case where part of the stress relieving layer 30 is in contact with the end surface of the second electrode layer 21B side of the electronic component 20 has been described. The stress relieving layer 30 may not be in contact with the end surface of the second electrode layer 21B but may be in contact with the side surface continuing from the end surface. In this case, the stress relieving layer 30 is not provided closer to the wiring layer 11 than the end surface of the electronic component 20 is (the end surface of the second electrode layer 21B). Even in this case, since the stress relieving layer 30 can prevent the external force from the direction different from the lamination direction from affecting the electronic component 20, it is possible to suppress the influence of the external force on the electronic component.

In the above embodiment, the electronic component 20 is built in the substrate 10 such that the first electrode layer 21A of the electronic component 20 is on the insulating layer 12 side and the second electrode layer 21B is on the wiring layer 11 side. The electronic component 20 may be built in the substrate 10 such that the second electrode layer 21B is on the insulating layer 12 side and the first electrode layer 21A is on the wiring layer 11 side.

Further, in the case where the stress relieving layer 30 has insulating properties (the first embodiment and the second embodiment), it is preferable that the vertical position of the stress relieving layer 30 (or the first stress relieving layer 30 A) overlap with the electronic component 20 in the lamination direction of the substrate 10. The height (thickness) of the stress relieving layer 30 can be appropriately changed.

In the third embodiment and the fourth embodiment (in the case where the stress relieving layer 30 has conductivity), the electronic component 20 and the stress relieving layer 30 are in contact with each other. Other layer having conductivity may be provided between the electronic component 20 and the stress relieving layer 30. However, in this case, the other layer needs to have a shape corresponding to the shape of the second electrode layer 21B of the electronic component 20.

Further, in the above embodiment, an example has been described in which each of the first electrode layer 21A and the second electrode layer 21B is divided into several parts in the electronic component 20 in the electronic component embedded substrate. The shapes of the first electrode layer 21A and the second electrode layer 21B are not limited to the above embodiments, and can be changed as appropriate.

What is claimed is:

1. An electronic component embedded substrate comprising:
   a substrate having a wiring layer and an insulating layer laminated on the wiring layer;
   an electronic component built in the substrate, and having a pair of electrode layers extending in a direction intersecting with a lamination direction of the substrate, and a dielectric layer provided between the pair of electrode layers; and
   a stress relieving layer provided closer to the wiring layer than the insulating layer is in the lamination direction, wherein:
   at least part of an end portion of the electronic component on the wiring layer side is in contact with the stress relieving layer in the lamination direction;
   at least part of an end portion of the electronic component on the insulating layer side is in contact with the insulating layer in the lamination direction;
   a Young's modulus of the stress relieving layer is lower than a Young's modulus of an electrode layer of the pair of electrode layers positioned on the wiring layer side;
   the stress relieving layer includes a first stress relieving layer having insulating properties and a second stress relieving layer having conductivity; and
   the second stress relieving layer is provided closer to an exposed surface of the wiring layer than the electrode layer positioned on the wiring layer side.

2. The electronic component embedded substrate according to claim 1,
   wherein at least part of the electronic component is embedded in the wiring layer, and
   the stress relieving layer is exposed from the wiring layer side of the electronic component embedded substrate.

3. The electronic component embedded substrate according to claim 1,
   wherein the stress relieving layer and the electronic component are sequentially laminated on the wiring layer, and
   the stress relieving layer is in contact with the wiring layer.

4. The electronic component embedded substrate according to claim 3, wherein the Young's modulus of the stress relieving layer is lower than a Young's modulus of the wiring layer.

5. The electronic component embedded substrate according to claim 1, wherein the stress relieving layer has insulation.

6. The electronic component embedded substrate according to claim 1, wherein:
   the stress relieving layer is closer to an exposed surface of the wiring layer than the electrode layer of the pair of electrode layers positioned on the wiring layer side; and
   the stress relieving layer has conductivity.

7. An electronic component embedded substrate comprising:
   a substrate having a wiring layer and an insulating layer laminated on the wiring layer;
   an electronic component built in the substrate, and having a pair of electrode layers extending in a direction intersecting with a lamination direction of the substrate, and a dielectric layer provided between the pair of electrode layers; and
   a stress relieving layer provided closer to the wiring layer than the insulating layer is in the lamination direction, wherein:
   at least part of an end portion of the electronic component on the wiring layer side is in contact with the stress relieving layer in the lamination direction;
   at least part of an end portion of the electronic component on the insulating layer side is in contact with the insulating layer in the lamination direction;
   a Young's modulus of the stress relieving layer is lower than a Young's modulus of an electrode layer of the pair of electrode layers positioned on the wiring layer side;
   at least part of the electronic component is embedded in the wiring layer; and
   the stress relieving layer is exposed from the wiring layer side of the electronic component embedded substrate.

8. The electronic component embedded substrate according to claim 7,
   wherein the stress relieving layer and the electronic component are sequentially laminated on the wiring layer, and
   the stress relieving layer is in contact with the wiring layer.

9. The electronic component embedded substrate according to claim 8, wherein the Young's modulus of the stress relieving layer is lower than a Young's modulus of the wiring layer.

10. The electronic component embedded substrate according to claim 7, wherein the Young's modulus of the stress relieving layer is lower than a Young's modulus of the insulating layer.

11. The electronic component embedded substrate according to claim 7, wherein the stress relieving layer has insulation.

12. The electronic component embedded substrate according to claim 7, wherein:
   the stress relieving layer is closer to an exposed surface of the wiring layer than the electrode layer of the pair of electrode layers positioned on the wiring layer side; and
   the stress relieving layer has conductivity.

13. An electronic component embedded substrate comprising:

a substrate having a wiring layer and an insulating layer laminated on the wiring layer;

an electronic component built in the substrate, and having a pair of electrode layers extending in a direction intersecting with a lamination direction of the substrate, and a dielectric layer provided between the pair of electrode layers; and a stress relieving layer provided closer to the wiring layer than the insulating layer is in the lamination direction, wherein:

at least part of an end portion of the electronic component on the wiring layer side is in contact with the stress relieving layer in the lamination direction;

at least part of an end portion of the electronic component on the insulating layer side is in contact with the insulating layer in the lamination direction;

a Young's modulus of the stress relieving layer is lower than a Young's modulus of an electrode layer of the pair of electrode layers positioned on the wiring layer side; and the Young's modulus of the stress relieving layer is lower than a Young's modulus of the insulating layer.

14. The electronic component embedded substrate according to claim 13, wherein at least part of the electronic component is embedded in the wiring layer, and the stress relieving layer is exposed from the wiring layer side of the electronic component embedded substrate.

15. The electronic component embedded substrate according to claim 13, wherein the stress relieving layer and the electronic component are sequentially laminated on the wiring layer, and the stress relieving layer is in contact with the wiring layer.

16. The electronic component embedded substrate according to claim 15, wherein the Young's modulus of the stress relieving layer is lower than a Young's modulus of the wiring layer.

17. The electronic component embedded substrate according to claim 13, wherein the Young's modulus of the stress relieving layer is lower than a Young's modulus of the insulating layer.

18. The electronic component embedded substrate according to claim 13, wherein the stress relieving layer has insulation.

19. The electronic component embedded substrate according to claim 13, wherein:

the stress relieving layer is closer to an exposed surface of the wiring layer than the electrode layer of the pair of electrode layers positioned on the wiring layer side; and the stress relieving layer has conductivity.

* * * * *